United States Patent
Pore

(10) Patent No.: US 9,362,109 B2
(45) Date of Patent: Jun. 7, 2016

(54) DEPOSITION OF BORON AND CARBON CONTAINING MATERIALS

(71) Applicant: ASM IP HOLDING B.V., Almere (NL)

(72) Inventor: Viljami Pore, Helsinki (FI)

(73) Assignee: ASM IP HOLDING B.V., Almere (NL)

( * ) Notice: Subject to any disclaimer, the term of this patent is extended or adjusted under 35 U.S.C. 154(b) by 0 days.

(21) Appl. No.: 14/515,395

(22) Filed: Oct. 15, 2014

(65) Prior Publication Data

US 2015/0104955 A1 Apr. 16, 2015

Related U.S. Application Data

(60) Provisional application No. 61/891,813, filed on Oct. 16, 2013.

(51) Int. Cl.
| | |
|---|---|
| *H01L 21/02* | (2006.01) |
| *C23C 16/30* | (2006.01) |
| *C23C 16/04* | (2006.01) |
| *C23C 16/32* | (2006.01) |
| *C23C 16/455* | (2006.01) |
| *H01L 21/311* | (2006.01) |

(52) U.S. Cl.
CPC .......... *H01L 21/0217* (2013.01); *C23C 16/045* (2013.01); *C23C 16/30* (2013.01); *C23C 16/32* (2013.01); *C23C 16/45523* (2013.01); *C23C 16/45525* (2013.01); *H01L 21/0228* (2013.01); *H01L 21/0234* (2013.01); *H01L 21/02112* (2013.01); *H01L 21/02211* (2013.01); *H01L 21/02271* (2013.01); *H01L 21/31111* (2013.01)

(58) Field of Classification Search
USPC ........................................................ 438/791
See application file for complete search history.

(56) References Cited

U.S. PATENT DOCUMENTS

| | | | |
|---|---|---|---|
| 4,683,147 A | 7/1987 | Eguchi et al. |
| 4,696,834 A | 9/1987 | Varaprath |
| 6,475,276 B1 | 11/2002 | Elers et al. |
| 6,586,056 B2 | 7/2003 | Arkles et al. |
| 6,933,245 B2 | 8/2005 | Lee et al. |

(Continued)

FOREIGN PATENT DOCUMENTS

| | | |
|---|---|---|
| JP | 2006-190770 | 7/2006 |
| JP | 2013-125762 | 6/2013 |

(Continued)

OTHER PUBLICATIONS

Pedersen, et al. "Low Temperature CVD of Thin, Amorphous Boron—Carbon Films for Neutron Detectors," 2012, Chemical Vapor Deposition, (18), 7-9, 221-224.

(Continued)

*Primary Examiner* — Asok K Sarkar
(74) *Attorney, Agent, or Firm* — Knobbe, Martens, Olson & Bear, LLP

(57) ABSTRACT

Methods of depositing boron and carbon containing films are provided. In some embodiments, methods of depositing B,C films with desirable properties, such as conformality and etch rate, are provided. One or more boron and/or carbon containing precursors can be decomposed on a substrate at a temperature of less than about 400° C. In some embodiments methods of depositing silicon nitride films comprising B and C are provided. A silicon nitride film can be deposited by a deposition process including an ALD cycle that forms SiN and a CVD cycle that contributes B and C to the growing film.

30 Claims, 15 Drawing Sheets

(56) References Cited

U.S. PATENT DOCUMENTS

| | | |
|---|---|---|
| 7,625,609 B2 | 12/2009 | Matsuura |
| 7,651,955 B2 | 1/2010 | Ranish et al. |
| 8,080,290 B2 | 12/2011 | Hasebe et al. |
| 8,114,761 B2 | 2/2012 | Mandrekar et al. |
| 8,119,544 B2 | 2/2012 | Hasebe et al. |
| 8,242,031 B2 | 8/2012 | Mallick et al. |
| 8,329,599 B2 | 12/2012 | Fukazawa et al. |
| 8,563,096 B2 | 10/2013 | Matsunaga et al. |
| 8,580,664 B2 | 11/2013 | Clark |
| 8,722,546 B2 | 5/2014 | Fukazawa et al. |
| 2001/0012701 A1 | 8/2001 | Kang et al. |
| 2002/0061659 A1 | 5/2002 | Abe |
| 2002/0119327 A1 | 8/2002 | Arkles et al. |
| 2002/0180028 A1 | 12/2002 | Borovik et al. |
| 2003/0097987 A1 | 5/2003 | Fukuda |
| 2003/0215570 A1 | 11/2003 | Seutter et al. |
| 2003/0228770 A1 | 12/2003 | Lee et al. |
| 2004/0121085 A1 | 6/2004 | Wang et al. |
| 2004/0146644 A1 | 7/2004 | Xiao et al. |
| 2005/0025885 A1 | 2/2005 | McSwiney et al. |
| 2005/0145177 A1 | 7/2005 | McSwiney et al. |
| 2005/0159017 A1 | 7/2005 | Kim et al. |
| 2005/0181633 A1 | 8/2005 | Hochberg et al. |
| 2006/0019032 A1 | 1/2006 | Wang et al. |
| 2006/0084283 A1 | 4/2006 | Paranjpe et al. |
| 2006/0148271 A1 | 7/2006 | Borovik et al. |
| 2007/0116888 A1 | 5/2007 | Faguet |
| 2007/0232071 A1 | 10/2007 | Balseanu et al. |
| 2007/0251444 A1 | 11/2007 | Gros-Jean et al. |
| 2008/0020591 A1 | 1/2008 | Balseanu et al. |
| 2008/0242116 A1 | 10/2008 | Clark |
| 2008/0274605 A1 | 11/2008 | Hoshi et al. |
| 2008/0292798 A1* | 11/2008 | Huh ............... C23C 16/342 427/343 |
| 2009/0155606 A1 | 6/2009 | Yoon et al. |
| 2009/0163041 A1 | 6/2009 | Mungekar et al. |
| 2009/0263972 A1 | 10/2009 | Balseanu et al. |
| 2009/0311857 A1 | 12/2009 | Todd et al. |
| 2010/0041243 A1 | 2/2010 | Cheng et al. |
| 2010/0124621 A1 | 5/2010 | Kobayashi et al. |
| 2010/0304574 A1 | 12/2010 | Nodera et al. |
| 2011/0086516 A1 | 4/2011 | Lee et al. |
| 2011/0129990 A1 | 6/2011 | Mandrekar et al. |
| 2011/0183528 A1 | 7/2011 | Wang et al. |
| 2011/0256734 A1 | 10/2011 | Hausmann et al. |
| 2012/0009802 A1 | 1/2012 | LaVoie et al. |
| 2012/0021127 A1 | 1/2012 | Sato et al. |
| 2012/0028469 A1 | 2/2012 | Onizawa et al. |
| 2012/0077350 A1 | 3/2012 | Miya et al. |
| 2012/0164848 A1 | 6/2012 | Fujii et al. |
| 2012/0178264 A1 | 7/2012 | Murakami et al. |
| 2012/0196450 A1 | 8/2012 | Balseanu et al. |
| 2012/0213940 A1 | 8/2012 | Mallick |
| 2013/0040447 A1 | 2/2013 | Swaminathan et al. |
| 2013/0078392 A1 | 3/2013 | Xiao et al. |
| 2013/0084714 A1 | 4/2013 | Oka et al. |
| 2013/0115763 A1 | 5/2013 | Takamure et al. |
| 2013/0157466 A1* | 6/2013 | Fox ............... H01L 21/30604 438/694 |
| 2013/0171839 A1 | 7/2013 | Nguyen et al. |
| 2013/0175621 A1 | 7/2013 | Chen et al. |
| 2013/0224964 A1 | 8/2013 | Fukazawa et al. |
| 2013/0252439 A1* | 9/2013 | Hirose ............... C23C 16/30 438/778 |
| 2013/0330933 A1 | 12/2013 | Fukazawa et al. |
| 2014/0023794 A1 | 1/2014 | Mahajani et al. |
| 2014/0030444 A1 | 1/2014 | Swaminathan et al. |
| 2014/0073144 A1 | 3/2014 | Chatterjee et al. |
| 2014/0113457 A1 | 4/2014 | Sims et al. |
| 2014/0124841 A1 | 5/2014 | Xie et al. |
| 2014/0193983 A1 | 7/2014 | LaVoie |
| 2014/0227458 A1 | 8/2014 | Karakawa |
| 2014/0273528 A1 | 9/2014 | Niskanen et al. |
| 2014/0273529 A1 | 9/2014 | Nguyen et al. |
| 2014/0342573 A1 | 11/2014 | Hirose et al. |
| 2014/0363980 A1 | 12/2014 | Kawamata et al. |
| 2015/0031218 A1 | 1/2015 | Karakawa |
| 2015/0104954 A1 | 4/2015 | Pore |
| 2015/0162185 A1 | 6/2015 | Pore |
| 2015/0206719 A1* | 7/2015 | Swaminathan ....... C23C 16/045 118/704 |
| 2015/0287591 A1 | 10/2015 | Pore et al. |

FOREIGN PATENT DOCUMENTS

| | | |
|---|---|---|
| WO | WO 2012/144523 | 10/2012 |
| WO | WO 2013/121936 | 8/2013 |

OTHER PUBLICATIONS

Cho, Namtae, "Processing of Boron Carbide," Ph.D. Thesis, School of Materials Science and Engineering, Georgia Institute of Technology, 2006, in 89 pages.

Domnich, et al., "Boron Carbide: Structures, Properties, and Stability under Stress," J. Am. Ceram. Soc., vol. 94., No. 11, 2011, pp. 3605-3628.

Pedersen et al., "Low Temperature CVD of Thin, Amorphous Boron—Carbon Films for Neutron Detectors," Chemical Vapor Deposition, vol. 18, Issue 7-9, 2012, pp. 221-224.

Sarubbi, et al., "Pure Boron-Doped Photodiodes: a Solution for Radiation Detection in EUV Lithography," ESSDERC 2008—38th European Solid-State Device Research Conference, 2008, pp. 278-281.

Office Action dated Oct. 6, 2015 in U.S. Appl. No. 14/167,904.

Final Office Action dated Feb. 24, 2015 in U.S. Appl. No. 14/167,904.

Keinan et al., "Diiodosilane. 1. A Novel Reagent for Deoxygenation of Alcohols and Ethers," J.Org. Chem., 1987, vol. 52, pp. 4846-4851.

Keinan et al., "Diiodosilane. 2. A Multipurpose Reagent for Hydrolysis and Reductive Iodination of Ketals, Acetals, Ketones, and Aldehydes," J. Org. Chem., 1990, vol. 55, pp. 2927-2938.

Keinan et al., "Diiodosilane. 3. Direct Synthesis of Acyl Iodides from Carboxylic Acids, Esters, Lactones, Acyl Chlorides, and Anhydrides," J. Org. Chem., 1990, vol. 55, pp. 3922-3926.

Lowenstein et al., "Chemical Etching of Thermally Oxidized Silicon Nitride: Comparison of Wet Dry Etching Methods," Journal of the Electrochemical Society 138.5, 1991, pp. 1389-1394.

Office Action dated Jun. 17, 2014 in U.S. Appl. No. 14/167,904.

Office Action dated Jun. 5, 2014 in U.S. Appl. No. 14/062,328.

Tamizhmani et al., "Physical Characterization of a-Si Thin Films Deposited by Thermal Decomposition of Iodosilanes," J. Phys.D: Appl. Phys., 1991, vol. 23, pp. 1015-1021.

Tamizhmani et al., "Some Physical Properties of Undoped Amorphous Silicon Prepared by a New Chemical Vapor Deposition Process Using Iodosilanes," Chem. Mater., 1990, vol. 2, pp. 473-476.

Triyoso et al., "Robust PEALD SiN spacer for gate first high-k metal gate integration", IEEE, 2012, 4 pages.

* cited by examiner

XRR Results

| TEB fraction | Thickness (nm) | Density (g/cm$^3$) | Roughness (nm) |
|---|---|---|---|
| 0.0% | 28.53 | 2.71 | 0.17 |
| 5.0% | 30.87 | 2.36 | 0.94 |
| 9.5% | 26.41 | 2.16 | 1.05 |
| 13.5% | 25.23 | 2.13 | 1.13 |

FIG. 10

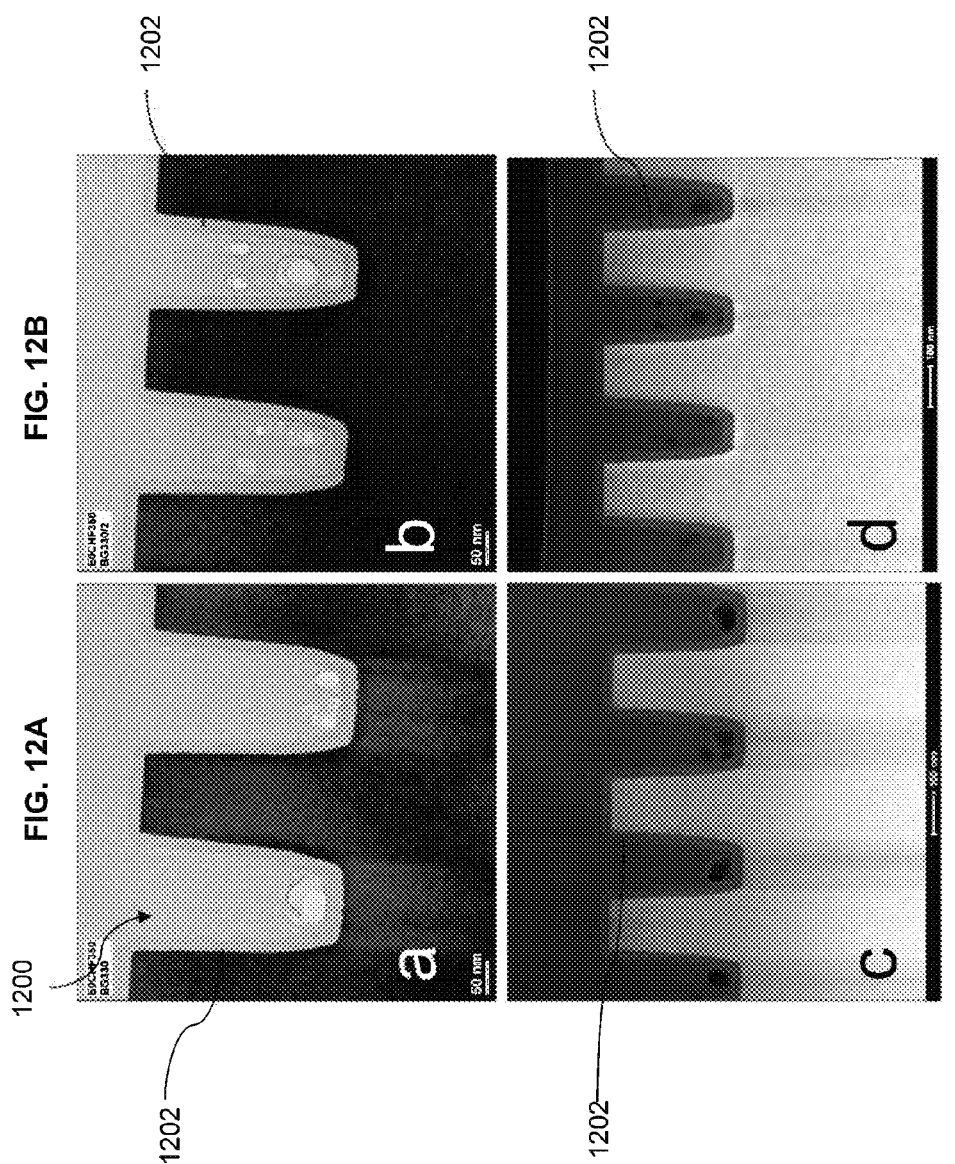

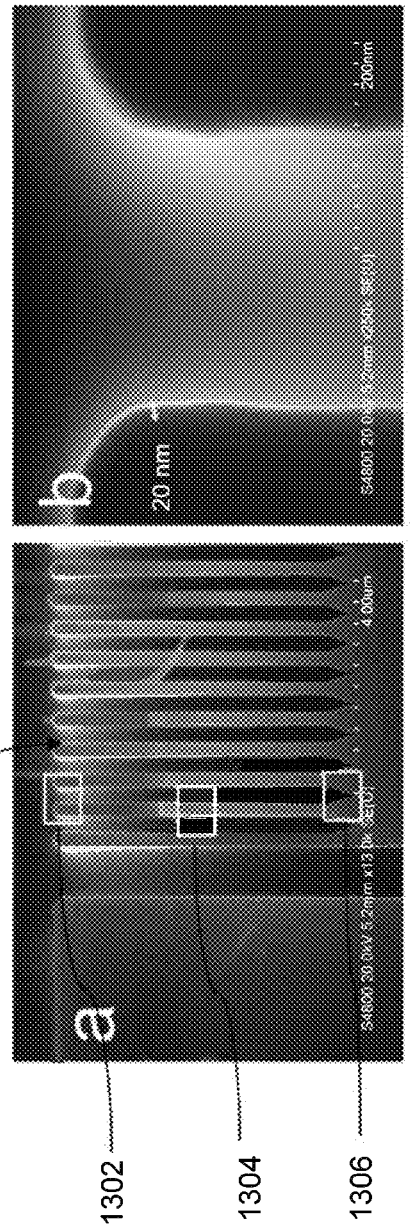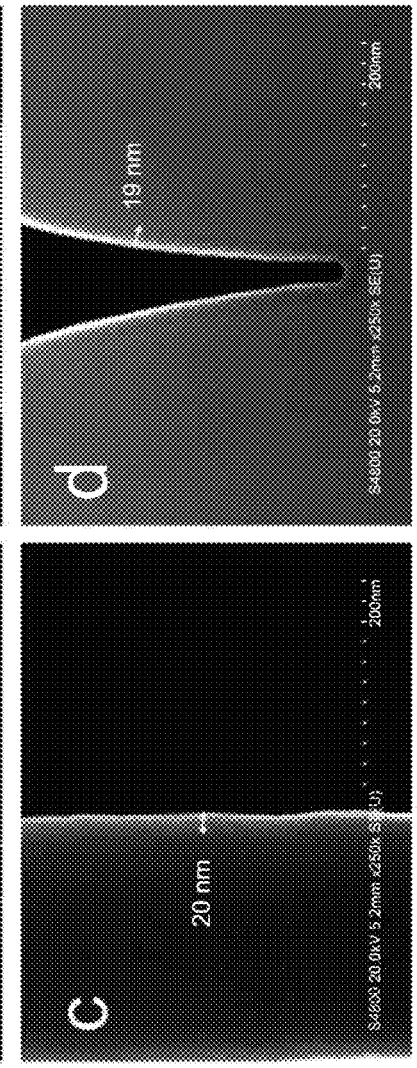
FIG. 13A
FIG. 13B
FIG. 13C
FIG. 13D

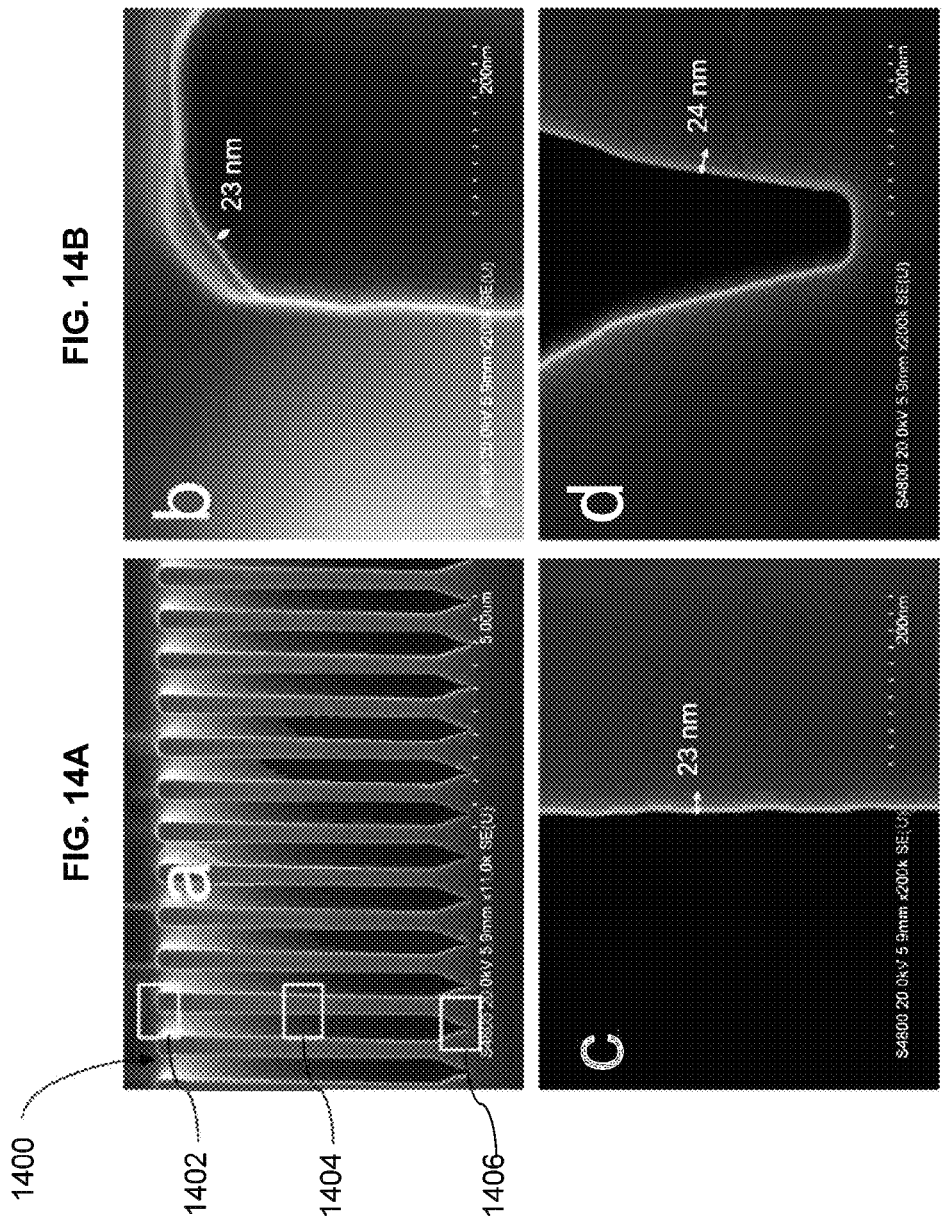

DEPOSITION OF BORON AND CARBON CONTAINING MATERIALS

BACKGROUND

1. Field

The present disclosure relates generally to the field of semiconductor device manufacturing and, more particularly, to deposition of boron and carbon containing materials.

2. Description of the Related Art

Boron and carbon containing materials, such as boron and carbon films, can have a wide variety of uses, including uses in the semiconductor industry. Silicon nitride based materials can be modified to include boron and carbon components, for example forming silicon nitride films comprising boron and carbon components. Boron and carbon films and silicon nitride films comprising boron and carbon components may have various applications in fabrication processes of semiconductor devices.

As the physical geometry of semiconductor devices shrinks, deposition of films on three-dimensional structures having high aspect ratios is desired. Therefore, deposition processes that provide films which can demonstrate conformal coverage of three-dimensional structures having high aspect ratios are desired. Additionally, films are desired that demonstrate an advantageous etch selectivity with respect one or more other materials in the semiconductor device, and/or a desirable etch rate in a dry etch and/or wet etch process.

SUMMARY

In some aspects, methods of forming silicon nitride films comprising boron and carbon are provided. in some embodiments, methods of depositing a silicon nitride based film comprising boron and carbon on a substrate in a reaction space can include contacting the substrate with a vapor-phase silicon reactant to form a layer of the reactant on a surface of the substrate; contacting the surface of the substrate comprising the silicon reactant with a nitrogen reactant; and contacting the substrate with a vapor phase boron and/or carbon reactant. In some embodiments, at least one of contacting the substrate with a vapor-phase silicon reactant, contacting the silicon reactant with a nitrogen precursor, and contacting the substrate with a vapor phase boron reactant are performed two or more times.

Methods of depositing a silicon nitride thin film comprising boron and carbon on a substrate in a reaction space can include exposing the substrate to a vapor-phase silicon precursor; removing excess silicon precursor and reaction byproducts from the reaction space, for example with a purge gas and/or vacuum; contacting the remaining silicon reactant on the substrate surface with a nitrogen precursor; and exposing the substrate to a vapor-phase boron precursor. In some embodiments, at least one of exposing the substrate to a vapor-phase silicon precursor, exposing the substrate to a purge gas and/or a vacuum, contacting the adsorbed silicon reactant with a nitrogen precursor, and exposing the substrate to a vapor-phase boron precursor, can be performed two or more times.

In some aspects, methods of forming boron carbon films are provided. in some embodiments, methods of depositing a boron and carbon film on a substrate in a reaction space can include contacting the substrate with a vapor phase boron precursor at a process temperature of about 325° C. to about 400° C. to form the boron and carbon film on the substrate, where the vapor phase boron precursor decomposes on the substrate.

In some embodiments, methods of forming a boron and carbon film on a substrate in a reaction space can include contacting a three-dimensional structure on the substrate with a vapor phase boron precursor at a process temperature of less than about 400° C. to form the boron and carbon film on the three-dimensional structure, where the boron and carbon film has a step coverage of greater than about 80%. In some embodiments, the methods can include purging the reaction space subsequent to contacting the three-dimensional structure on the substrate with the vapor phase boron precursor.

For purposes of summarizing the invention and the advantages achieved over the prior art, certain objects and advantages are described herein. Of course, it is to be understood that not necessarily all such objects or advantages need to be achieved in accordance with any particular embodiment. Thus, for example, those skilled in the art will recognize that the invention may be embodied or carried out in a manner that can achieve or optimize one advantage or a group of advantages without necessarily achieving other objects or advantages.

All of these embodiments are intended to be within the scope of the invention herein disclosed. These and other embodiments will become readily apparent to those skilled in the art from the following detailed description having reference to the attached figures, the invention not being limited to any particular disclosed embodiment(s).

BRIEF DESCRIPTION OF THE DRAWINGS

These and other features, aspects, and advantages of the present disclosure are described with reference to the drawings of certain embodiments, which are intended to illustrate certain embodiments and not to limit the invention.

FIG. 10 shows XRR data of examples of silicon nitride films comprising boron and carbon deposited according to embodiments disclosed herein.

FIGS. 12A-12D are SEM images showing etch performance of an example of a silicon nitride film comprising boron and carbon.

FIGS. 13A-13D are SEM images showing etch performance of an example of a silicon nitride film comprising boron and carbon components.

FIGS. 14A-14D are SEM images showing step coverage of an example of a silicon nitride film comprising boron and carbon components.

DETAILED DESCRIPTION

Figure 1:
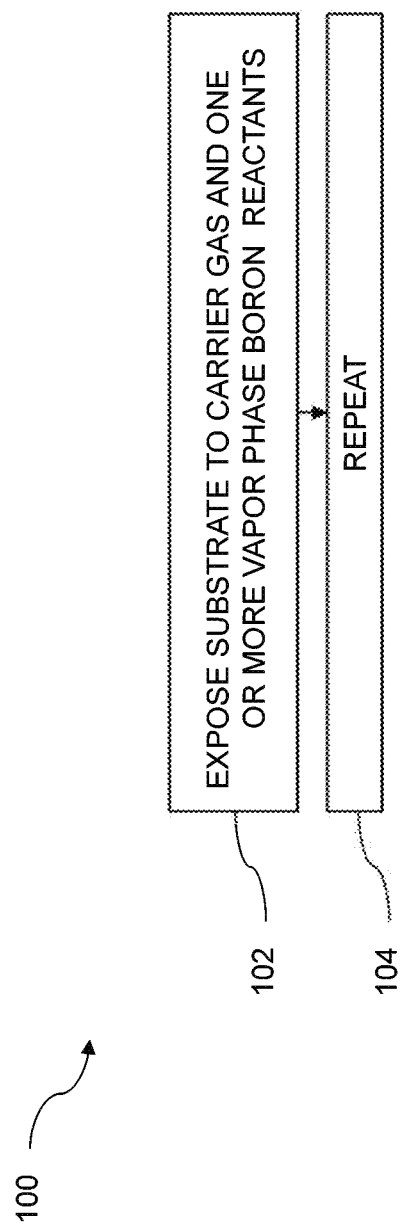
FIG. 1 shows a flow chart of an example of a process for depositing a boron and carbon film, according to an embodiment.

Although certain embodiments and examples are described below, those of skill in the art will appreciate that the invention extends beyond the specifically disclosed embodiments and/or uses and obvious modifications and equivalents thereof. Thus, it is intended that the scope of the invention herein disclosed should not be limited by any particular embodiments described below.

Films comprising boron and carbon can have a variety of desirable properties, including chemical stability, mechanical strength, and thermal and electrical properties. As a result, such films have diverse applications in many technical fields, including applications in the semiconductor, medical, military, space and nuclear industries. For example, boron carbon films are used as neutron detectors, in the fabrication of semiconductor devices, and in the fabrication of microelectromechanical systems (MEMS). They may be used in tribological coatings for MEMS components and/or as sacrificial films in semiconductor device fabrication processes. In some embodiments, boron and carbon-containing films can be used as an etch stop layer, as a layer for facilitating photolithography patterning processes, and/or as a doping layer (e.g., as a boron dopant source). Other uses outside of the semiconductor area will be apparent to the skilled artisan.

In some embodiments films comprised essentially of boron and carbon films are disclosed, along with methods for making such films, while in other embodiments films comprising boron and/or carbon as well as other components are disclosed, along with methods for making such films. For example, in some embodiments silicon nitride films can be formed that include boron and carbon components. Silicon nitride films comprising boron and carbon can have a wide variety of applications, including in semiconductor devices. Silicon nitride films comprising boron and carbon components can form a part of semiconductor devices (e.g., FinFETs), and/or be a part of processes for fabricating semiconductor devices. For example, silicon nitride films comprising boron and carbon components can be deposited on three-dimensional (3-D) features during semiconductor device fabrication processes, for example as a spacer material for a transistor gate feature (e.g., as spacer material of gate features in multi-gate transistors such as FinFETs), and/or as a sacrificial layer in the semiconductor device fabrication process.

One or more processes described herein may be used to form boron carbon films and/or silicon nitride films comprising boron and carbon, where the films have one or more desirable characteristics, such as a desirable level of conformal coverage of three-dimensional features, a desirable dry etch rate, a desirable wet etch rate, and/or a desirable etch selectivity with respect to another material (e.g., a thermal silicon oxide (TOX) layer in a semiconductor device). For example, films deposited according to one or more processes described herein, such as a boron and carbon film or a silicon nitride film comprising boron and carbon, can demonstrate improved step coverage, reduced etch rate in a wet etchant (e.g., resistance against wet etchant, such as a dilute hydrofluoric acid (HF or dHF) solution, such as a 0.5 weight % HF solution), and/or a reduced wet etch ratio with respect to a thermal silicon oxide (TOX) material (e.g., to provide a ratio of a wet etch rate of the silicon nitride based film to a wet etch rate of the TOX of less than about 1, including less than about 0.5) relative to similar films deposited by other methods. In some embodiments, a silicon nitride film including boron and carbon components can have a desirable dielectric constant (κ-value), for example suitable for use as a spacer material for a transistor gate feature. In some embodiments, a silicon nitride film including boron and carbon components can have a dielectric constant of less than about 7, including between about 4.8 and about 7, and between about 4.8 and about 6, as discussed below.

Boron and Carbon Films

As described herein, films comprised primarily of boron and carbon (also referred to boron carbon films, or B,C films, as discussed below) and formed according to one or more processes described herein can advantageously demonstrate various desirable characteristics. In some embodiments, the boron and carbon films can advantageously demonstrate desirable levels of conformality when deposited on three-dimensional (3-D) features of a substrate, such as 3-D features having high aspect ratios. For example, the boron and carbon films may have a conformality of greater than about 90%, including greater than about 95%, when deposited on features having aspect ratios of about 3:1 or higher, including about 10:1 or higher, about 20:1 or higher, about 25:1 or higher, about 40:1 or higher, about 50:1 or higher, or about 80:1 or higher. In some embodiments, the boron and carbon films have a conformality greater than about 90%, including greater than about 95%, when deposited on features having aspect ratios of about 20:1 or greater, including about 40:1 or higher, and about 80:1 or greater.

In some embodiments, the boron and carbon films can demonstrate reduced wet etch rates. For example, the boron and carbon films can demonstrate reduced wet etch rates in dilute hydrofluoric acid solutions (dHF) (e.g., an etch rate of less than about 0.3× that of TOX films exposed to the dHF). In some embodiments, the boron and carbon films can have negligible wet etch rates in dilute HF. In some embodiments, the boron and carbon films have a wet etch rate of less than about 0.2 nanometers per min (nm/min) in dilute HF, preferably less than about 0.1 nm/min, and more preferably less than about 0.05 nm/min. In some embodiments, the boron and carbon films can exhibit etch rates of less than about 0.2 nm/min, preferably less than about 0.1 nm/min, and more preferably less than about 0.05 nm/min, in wet etchants comprising nitric acid ($HNO_3$) sodium hydroxide (NaOH), hydrochloric acid (HCl) sulfuric acid ($H_2SO_4$), and/or phosphoric acid ($H_3PO_4$). In some embodiments the wet etch rate is below the detection limit using one of the recited etchants.

In some embodiments, boron and carbon films formed according to one or more processes described herein demonstrate desirable etch resistance while having a desirable film density, such as film densities of about 2.0 to about 2.5 grams per cubic centimeter ($g/cm^3$). For example, the boron and carbon films may have wet etch rates as described herein while having film densities of about 2.0 $g/cm^3$ to about 2.5 $g/cm^3$.

In some embodiments, the boron and carbon films can demonstrate one or more of these desirable characteristics prior to being subjected to a post-deposition treatment process, such as the post-deposition treatment processes that are described in further detail herein. In some embodiments, a post-deposition treatment process further improves one or more of these desirable characteristics.

In some embodiments, a boron and carbon film deposited on a surface comprising silicon (e.g., on a surface of a silicon based layer, such as a silicon layer, a silicon nitride layer, a silicate layer etc. . . . ) can demonstrate increased uniformity and/or conformality, such as compared to a boron and carbon film deposited on a surface of a different material (such as a material that does not comprise silicon). For example, a boron and carbon film deposited on a silicon nitride (SiN) surface (e.g., on a surface of a silicon nitride layer, for example on a silicon nitride substrate) can demonstrate increased uniformity. Without being limited by any particular theory or mode of operation, an improved interaction between the silicon-based surface and one or more components of the boron and carbon film may advantageously facilitate the improved uniformity and/or conformality of the deposited film.

As discussed above, a boron and carbon film typically comprises primarily boron and carbon. The formula of a boron and carbon film is generally referred to herein as B,C for convenience and simplicity. However, the skilled artisan will understand that the actual formula of a B,C film can be $B_xC$. In some embodiments, for example, x can vary from about 0.1 to about 25. In some cases, x preferably varies from about 1 to about 10, and more preferably from about 1 to about 2. For example, x can be about 1.5.

In some embodiments, a boron and carbon film is deposited on a substrate by a CVD process comprising decomposing one or more boron precursors (e.g., boron reactants) on a substrate surface at a temperature of less than about 400° C., and at a pressure of about 0.1 Torr to about 10 Torr. In some embodiments, a boron precursor may comprise both boron and carbon. Thus, in some embodiments a CVD process for depositing a boron and carbon film may include decomposition of a single boron precursor comprising both boron and carbon. In some embodiments, a CVD process comprises decomposing two or more precursors on the substrate surface to form the boron and carbon film. In some embodiments, at least one of the two or more precursors comprises boron (B). In some embodiments, at least one of the two or more precursors comprises carbon (C).

In some embodiments, no or substantially no plasma is used in the deposition of the boron and carbon films (e.g., no or substantially no plasma is used for boron and carbon film growth). In some embodiments, a CVD process may be a pulsed thermal CVD process in which multiple pulses of a single boron precursor are provided to deposit a film of desired thickness. In some embodiments, a single, pulse of the boron precursor is provided to deposit a film of the desired thickness. A thermal CVD process may comprise no plasma or substantially no plasma in the decomposition of precursors. In some embodiments, a purge step may be performed between boron precursor pulses, for example to remove excess reactant and/or reaction byproducts from the reaction space. In some embodiments the substrate may be moved to a space in which it is not exposed to the precursor. In some embodiments, a boron precursor pulse can comprise one or more carrier gases, such as nitrogen gas, helium gas, neon gas, and/or xenon gas. In some embodiments, the boron precursor pulse comprises a mixture of two or more carrier gases. In some embodiments, a mixture of two or more carrier gases comprises argon gas and/or hydrogen gas. For example, a mixture of two or more carrier gases can comprise two or more gases selected from nitrogen gas, helium gas, neon gas, xenon gas, argon gas, and hydrogen gas.

FIG. 1 shows a flow chart 100 illustrating a process for forming a boron and carbon (B,C) film. In block 102, a substrate is exposed to one or more vapor phase boron reactants (e.g., boron and/or carbon precursors). A carrier gas may be used to transport the one or more vapor phase boron reactants to the substrate. In some embodiments the carrier gas may facilitate one or more interactions between reactants and/or between reactants and the substrate surface for forming the boron and carbon film, while not or substantially not contributing to growth of the boron and carbon film.

In some embodiments, the substrate is exposed to a single vapor phase boron reactant. In some embodiments, the single vapor phase boron reactant comprises both boron (B) and carbon (C). In some embodiments, the substrate is exposed to two or more vapor phase boron reactants. For example, at least one of the two or more vapor phase boron reactants comprises carbon (C). In some embodiments, at least one of the two or more vapor phase boron reactants comprises boron (B).

In some embodiments, the carrier gas can comprise an inert carrier gas, such as nitrogen gas ($N_2$), helium (He), xenon (Xe) and/or neon (Ne). In some embodiments, the carrier gas can comprise a mixture of two or more gases, including two or more gases selected from nitrogen gas, helium gas, neon gas, xenon gas, argon gas, and hydrogen gas. In block 104, exposure of the substrate to the carrier gas and the one or more vapor phase boron reactants can be repeated a number of times, such as in a pulsed CVD process. For example, the substrate can be exposed to the carrier gas and the one or more boron carbon vapor phase reactants for a first duration of time, and the exposure may be repeated about 5 times to about 5,000 times, including about 100 times to about 3,000 times, including about 1000 times, and about 2,000 times. The duration of time may be the same in each of the repetitions, or cycles, or may vary between one or more cycles. The number of repetitions can be selected to facilitate deposition of a boron and carbon film of a desired thickness, for example. In some embodiments, an exposure of the substrate to the carrier gas and the one or more vapor phase boron reactants may be followed by discontinuing flow of the one or more vapor phase boron reactants into the reaction space. In some embodiments, an exposure of the substrate to the carrier gas and the one or more vapor phase boron reactants can be followed by a purge step and/or transport of the substrate to a space away from the reactants (e.g., such that the substrate is not or substantially not exposed to the reactants). The purge step may be configured to remove one or more excess reactants and/or reaction byproducts from the reactor chamber. In some embodiments, a purge step and/or transport of the substrate follows each exposure of the substrate to the carrier gas and the one or more vapor phase boron reactants. For example, subsequent to each exposure of the substrate to the reactant(s) in each cycle, the substrate may be moved to a space free or substantially free of the reactants, or the reactor may be purged of excess reactants and/or reaction byproducts. In some embodiments, the purge step comprises continuing flow of the carrier gas (e.g., continuing flow of the carrier gas, such as at least one component of a multi-component carrier gas, at a same or different flow rate as compared to that during the reactant pulse). For example, a process 100 for depositing boron and carbon films may include continuously flowing the carrier gas while periodically flowing the one or more vapor phase boron reactants.

In some embodiments a process for depositing a boron and carbon (B,C) film may include a chemical vapor deposition (CVD) process. Referring to FIG. 1, in some embodiments the process 100 includes a thermal CVD process performed at reduced process temperatures, for example temperatures less than about 400° C. A thermal CVD process can be a process in which no or substantially no plasma is applied, such as for facilitating decomposition of precursors used to deposit the film. The process temperature as referred to herein can comprise a temperature of a reactor chamber susceptor, a reactor chamber wall, and/or a temperature of the substrate itself. For example, in some embodiments the process 100 for depositing the boron and carbon film can be performed with a process temperature of up to about 400° C. In some embodiments, the process 100 for depositing the boron and carbon film can be performed with a process temperature of about 325° C. to about 400° C., preferably about 350° C. to about 400° C., and most preferably about 375° C. to about 400° C. Without being limited by any particular theory or mode of operation, deposition of boron and carbon films at temperatures less than about 400° C. may advantageously facilitate deposition in a surface reaction limited regime, facilitating formation of boron and carbon films having one or more desirable characteristics described herein (e.g., increased conformality performance and/or decreased etch rate).

In some embodiments, deposition of boron and carbon films (B,C) can be performed at process temperatures of about 400° C. to about 450° C., including for example, about 400° C. to about 425° C.

According to some embodiments of the present disclosure, the pressure of the reactor chamber during processing is maintained at about 0.01 Torr to about 50 Torr, preferably from about 0.1 Torr to about 10 Torr. In some embodiments, deposition of boron and carbon films can be performed with a reactor chamber pressure of about 0.5 Torr to about 3 Torr. The selected reaction chamber pressure may serve to facilitate formation of boron and carbon films having desired conformality and/or etch rate performances.

As described herein, a carrier gas may comprise an inert carrier gas, such as nitrogen gas ($N_2$), helium (He), xenon (Xe) and/or neon (Ne). For example, block 102 of FIG. 1 may include exposing a substrate to one or more boron reactants and nitrogen gas. Without being limited by any particular theory or mode of operation, nitrogen gas, helium, xenon, and neon can exhibit an increased thermal conductivity (e.g., for example a greater thermal conductivity as compared to that of other inert carrier gases, such as argon (Ar)), thereby facilitating decomposition of the one or more boron and/or carbon precursors. Further, without being limited by any particular theory or mode of operation, a carrier gas having an increased thermal conductivity may facilitate decomposition of the one or more boron and/or carbon precursors in high aspect ratio features of a 3-D substrate surface, facilitating formation of a conformal and/or etch resistant boron and carbon film over the high aspect ratio features. For example, use of carrier gas comprising nitrogen gas, helium, xenon, and/or neon, including carrier gas mixtures comprising two or more of nitrogen gas, helium, xenon, neon, argon and/or hydrogen, may facilitate formation of a conformal and/or etch resistant boron and carbon film.

In some embodiments, a process 100 for depositing the boron and carbon (B,C) film comprises a pulsed thermal CVD process. For example, the process 100 may comprise contacting the substrate with a reactant for a desired amount of time, such as by supplying into the reactor chamber a reactant pulse for a desired duration. The reactant pulse may comprise a carrier gas (e.g., nitrogen gas, helium and/or neon) and one or more boron reactants. In some embodiments, the reactant pulse is repeated a number of times to deposit a boron and carbon film of desired thickness and/or composition. In some embodiments one or more reactant pulse can be followed by a purge step and/or transport of the substrate into a space free or substantially free of the reactants. For example, the substrate may first be transported to a space free or substantially free of the reactants and the reactor chamber may then be purged of any excess reactants and/or reaction byproducts. For example, each reactant pulse of a plurality of reactant pulses may be followed by a purge step and/or transport of the substrate to a space free or substantially free of the reactants. The purge step may be configured to remove one or more excess reactants and/or reaction byproducts from the reactor chamber. For example, a purge step may comprise flowing one or more purge gases through the reactor chamber, and/or evacuating the reactor chamber to remove or substantially remove excess reactants and/or reaction byproducts (e.g., by drawing a vacuum upon the reactor chamber). In some embodiments, the purge gas comprises an inert gas. In some embodiments, the purge gas comprises nitrogen gas. In some embodiments, the purge gas comprises a noble gas.

In some embodiments, a reactant pulse can be followed by discontinuing flow of the one or more vapor phase boron reactants into the reactor chamber while continuing flow of the carrier gas. For example, a purge step may comprise continued flow of the carrier gas (e.g., at a same or different flow rate, such as a higher flow rate, as compared to that during the reactant pulse) for purging the reactor chamber. For example, a purge step may comprise continuing flow of at least one component of a carrier gas comprising a mixture of two or more gases for purging the reactor chamber. In some embodiments, a process 100 for depositing boron and carbon films may include continuously flowing the carrier gas while alternating flow of the one or more vapor phase boron reactants.

A duration of the reactant pulse can be selected to provide a desired quantity of the one or more boron reactants into the reactor chamber. In some embodiments, a reactant pulse can have a duration of about 0.1 seconds (s) to about 5 s, including about 0.1 s to about 1 s. For example, a reactant pulse can have a duration of about 0.5 s. In some embodiments, an interval between reactant pulses can be about 1 s to about 15 s. In some embodiments, the interval comprises a purge step for purging excess reactants and/or reaction byproducts from the reactor chamber. In some embodiments, the interval comprises transport of the substrate to a space free or substantially free of reactants. For example, the interval may comprise transport of the substrate to a space free or substantially free of reactants, and a purge step having a duration of about 1 s to about 15 s, including about 1 s to about 10 s. For example, the purge step can have a duration of about 5 s.

In some embodiments, a duration of the reactant pulse and/or the interval between reactant pulses (e.g., including for example, duration of a purge step) can be selected based a surface area of the substrate on which the boron and carbon film is deposited, an aspect ratio of a three dimensional (3-D) structure on which the boron and carbon film is deposited, and/or a configuration of the reactor chamber. For example, the reactant pulse and/or the interval between reactant pulses may have an increased duration for depositing a boron and carbon film on a larger surface area, 3-D structures having increased aspect ratios, and/or for deposition in a batch reactor. In some embodiments, an increased reactant pulse duration and/or interval between reactant pulses is selected for deposition on ultra-high aspect ratio features, including for example, features having aspect ratios of about 40:1 and greater, including about 80:1 and greater.

In some embodiments, the one or more boron reactants are supplied into the reactor chamber from a respective source container in which the reactants are stored in vapor form. Vapor pressure of each reactant can facilitate delivery of the reactant into the reactor chamber. For example, the vaporized reactants can be provided into the reactor chamber using a vapor draw technique. In some embodiments, a source container can be maintained at a temperature of about 20° C. to about 25° C. A mass flow rate of a vaporized reactant into the reactor chamber may be controlled, for example, by controlling the extent to which a supply valve for providing the vaporized reactant into the reactor chamber is kept open.

In some embodiments, a suitable boron reactant may include one or more compounds comprising a B—C bond. In some embodiments, a suitable boron reactant can include a boron compound having at least one organic ligand. In some embodiments, the organic ligand can have double and/or triple bonds. In some embodiments, the organic ligand can be a cyclic ligand. In some embodiments, the organic ligand can comprise delocalized electrons. In some embodiments, a suitable boron reactant can include trialkylboron compounds. In some embodiments, a suitable boron reactant can include triethylboron ($B(C_2H_5)_3$, TEB). In some embodiments, a suitable boron reactant can include trimethylboron ($B(CH_3)_3$, TMB). In some embodiments, a suitable boron reactant can include trialkylboron compounds having linear or branched alkyl groups, including for example linear or branched C3-C8, and more preferably including linear or branched C3-C5. Suitable boron reactants can include a variety of other boron-containing reactants. In some embodiments, a boron reactant can include a boron halide, an alkylboron, and/or a borane. In some embodiments, a boron reactant can include boron halides, borane halides and complexes thereof. For example, a suitable boron halide can have a boron to halide ratio of about 0.5 to about 1.

Suitable boranes can include compounds according to formula I or formula II.

$$B_nH_{n+x} \quad \text{(formula I)}$$

Wherein n is an integer from 1 to 10, preferably from 2 to 6, and x is an even integer, preferably 4, 6 or 8.

$$B_nH_m \quad \text{(formula II)}$$

Wherein n is an integer from 1 to 10, preferably form 2 to 6, and m is an integer different than n, from 1 to 10, preferably from 2 to 6.

Of the above boranes according to formula I, examples include nido-boranes ($B_nH_{n+4}$), arachno-boranes ($B_nH_{n+6}$) and hyph-boranes ($B_nH_{n+8}$). Of the boranes according to formula II, examples include conjuncto-boranes ($B_nH_m$). Also, borane complexes such as $(CH_3CH_2)_3N$—$BH_3$ can be used.

In some embodiments, suitable boron reactants can include borane halides, particularly fluorides, bromides and chlorides. An example of a suitable compound is $B_2H_5Br$. Further examples comprise boron halides with a high boron/halide ratio, such as $B_2F_4$, $B_2Cl_4$ and $B_2Br_4$. It is also possible to use borane halide complexes.

In some embodiments, halogenoboranes according to formula III can be suitable boron reactants.

$$B_nX_n \quad \text{(formula III)}$$

Wherein X is Cl or Br and n is 4 or an integer from 8 to 12 when X is Cl, or n is an integer from 7 to 10 when X is Br.

In some embodiments, carboranes according to formula IV can be suitable boron reactants.

$$C_2B_nH_{n+x} \quad \text{(formula IV)}$$

Examples of carboranes according to formula IV include closo-carboranes ($C2B_nH_{n+2}$), nido-carboranes ($C_2B_nH_{n+4}$) and arachno-carboranes ($C_2B_nH_{n+6}$).

In some embodiments, amine-borane adducts according to formula V can be suitable boron reactants.

$$R_3NBX_3 \quad \text{(formula V)}$$

Wherein R is linear or branched C1 to C10, preferably C1 to C4 alkyl or H, and X is linear or branched C1 to C10, preferably C1 to C4 alkyl, H or halogen.

In some embodiments, aminoboranes where one or more of the substituents on B is an amino group according to formula VI can be suitable boron reactants.

$$R_2N \quad \text{(formula VI)}$$

Wherein R is linear or branched C1 to C10, preferably C1 to C4 alkyl or substituted or unsubstituted aryl group.

An example of a suitable aminoborane is $(CH_3)_2NB(CH_3)_2$.

In some embodiments, a suitable boron reactant can include a cyclic borazine (—BH—NH—)$_3$ and/or its volatile derivatives.

In some embodiments, alkyl borons or alkyl boranes can be suitable boron reactants, wherein the alkyl is typically linear or branched C1 to C10 alkyl, preferably C2 to C4 alkyl.

According to some embodiments, a process for depositing a boron and carbon (B,C) film comprises a pulsed thermal CVD process performed at a process temperature of about 375° C. to about 400° C., and at a pressure of about 0.5 Torr to about 3 Torr. The process may include contacting the substrate with a reactant pulse comprising nitrogen gas as the carrier gas and triethylboron (TEB) as the boron and carbon reactant. The supply of TEB may be drawn from a source container for storing TEB at a temperature of about 20° C. to about 25° C. (e.g., a needle valve for providing TEB flow into the reactor chamber may be kept open at about two turns). The reactant pulse may have a duration of about 0.5 s. In some embodiments a single cycle of the process may include the reactant pulse followed by a period of time in which the substrate is not exposed to the reactant, such as a purge step. The purge step may comprise flowing nitrogen gas without the reactant, for example for a duration of about 5 s. The process may include repeating the cycle comprising the reactant pulse followed by the purge step a number of times to achieve a boron and carbon film of a desired thickness and/or composition. For example, the cycle may be repeated up to about 1,000 times, about 1,500 times, about 2,000 times, or about 5,000. In some embodiments, the cycle can be repeated about 2 to about 1,000 times, including about 2 to about 2,000 times, about 3 to about 2,000 times, or about 5 to about 5,000 times. In the cycle can be repeated from about 10 to about 100 times. In some embodiments, the cycle can be repeated about 50 to about 2,000 times. In some embodiments, the cycle can be repeated about 100 to about 1,500 times.

One or more boron and carbon (B,C) films formed according to one or more processes described herein may advantageously demonstrate desired conformality, such as when deposited on high aspect ratio features of 3-D substrate surfaces, and/or desired etch rate performances (e.g., wet etch rate performance, such as wet etch rate performance in dilute HF solution). The films may also exhibit a reduced film density, such as film densities of about 2.0 grams per cubic centimeter (g/cm$^3$) to about 2.5 g/cm$^3$. In some embodiments, the boron and carbon films can demonstrate a conformality of greater than about 80%, preferably greater than about 90% and more preferably greater than about 95%, for example when the boron and carbon films are formed on 3-D structures having aspect ratios of about 3:1 or higher, including about 10:1 or higher, about 25:1 or higher, or about 50:1 or higher. In some embodiments, the boron and carbon films can demonstrate a conformality of greater than about 80%, preferably greater than about 90% and more preferably greater than about 95%, when the boron and carbon films are formed on 3-D structures having aspect ratios of about 20:1 or greater, about 40:1 or greater, or about 80:1 or greater. For example, one or more boron and carbon films formed according to one or more processes described herein may demonstrate a conformality performance of greater than about 95% when deposited on high aspect ratio features of a 3-D substrate surface, including aspect ratios of up to about 250:1, including about 150:1 and about 100:1.

As described herein, a boron and carbon (B,C) film can be used in some embodiments as a sacrificial film in a semiconductor device fabrication process. For example, the boron and carbon film may be selectively removed in an etch process. In some embodiments, a boron and carbon film may form a part of a finished semiconductor device. For example, the boron and carbon film may be more resistant to etch than one or more other materials used in the fabrication of the semiconductor device. In some embodiments, the boron and carbon film may be etched by a dry etch process and/or a wet etch process. In some embodiments, a sacrificial boron and carbon film can be selectively removed during fabrication of a semiconductor device using an etch process comprising chlorine (Cl) and/or fluorine (F), such as chlorine and/or fluorine containing plasma processes. In some embodiments, the boron and carbon films can be more resistant to one or more etchants, including wet etchants such as dilute HF solutions.

In some embodiments, the boron and carbon film can demonstrate a desired wet etch selectivity, such as a wet etch selectivity with respect to a thermal silicon oxide (TOX) layer. For example, the boron an carbon film may be more resistant to wet etch than the thermal silicon oxide layer, having a ratio of a wet etch rate of the boron an carbon film to a wet etch rate of a thermal silicon oxide layer less than about 1 (e.g., in dilute HF solution), less than about 0.5, or less than about 0.3. In some embodiments, the ratio of a wet etch rate of the boron and carbon film to a wet etch rate of the thermal silicon oxide layer can be less than about 0.1. In some embodiments, the ratio of a wet etch rate of the boron and carbon film to a wet etch rate of the thermal silicon oxide layer can be less than about 0.05.

In some embodiments, the boron and carbon film can advantageously demonstrate desirable wet etch rates, including etch rates in dilute HF solution. For example, the boron and carbon film can advantageously demonstrate etch rates of less than about 0.2 nanometers per minute (nm/min), including preferably less than about 0.1 nm/min, more preferably less than about 0.05 nm/min, and most preferably less than about 0.02 nm/min.

In some embodiments, the boron and carbon film can demonstrate wet etch rates of less than about 0.2 nm/min, including preferably less than about 0.1 nm/min, more preferably less than about 0.05 nm/min, and most preferably less than about 0.02 nm/min in the following wet etchant solutions and at the specified temperatures: phosphoric acid ($H_3PO_4$) solution at a concentration of about 85 weight % at about room temperature (e.g., a temperature of about 25° C.), a concentrated nitric acid $HNO_3$ solution (e.g., a solution having a $HNO_3$ concentration of about 65 to about 75 weight %) at about 80° C., a 5.5 weight % hydrofluoric acid (HF) at about room temperature (e.g., a temperature of about 25° C.), a solution having a ratio of nitric acid:hydrofluoric acid:water ($HNO_3$:HF:$H_2O$) at about 1:1:5 at about room temperature (e.g., a temperature of about 25° C.), an aqueous solution of sodium hydroxide (NaOH) having a concentration of NaOH of about 10 weight % at about room temperature (e.g., a temperature of about 25° C.), a concentrated hydrochloric acid (HCl) solution (e.g., a solution having an HCl concentration of about 35 to about 40 weight %) at about room temperature (e.g., a temperature of about 25° C.), and a concentrated sulfuric acid solution ($H_2SO_4$) (e.g., a solution have a $H_2SO_4$ concentration of greater than about 90 weight %) at about room temperature (e.g., a temperature of about 25° C.).

In some embodiments, the boron and carbon film may be selectively removed. In some embodiments, the boron and carbon film can have a etch selectivity (e.g., a dry etch and/or a wet etch selectivity) with respect to another material, such as a film of a different composition, in the device of about 5 or greater, including a selectivity of about 10 or greater, about 20 or greater, or about 50 or greater.

In some embodiments, a portion of a boron and carbon film deposited on a sidewall of a three-dimensional structure can demonstrate a desired etch rate, for example, as compared to an etch rate of a portion of the film deposited on a top surface of the three-dimensional feature. In some embodiments, a portion of a boron and carbon film deposited on a sidewall of a three-dimensional structure can demonstrate a uniform or substantially uniform etch rate as a portion of the boron and carbon film deposited on a top surface of the structure. For example, a ratio of an etch rate of a sidewall portion of the boron and carbon film to an etch rate of a top surface portion of the boron and carbon film can be less than about 4, including less than about 2, about 1.5. In some embodiments, the ratio is about 1. In some embodiments, a uniformity of a top surface portion and a sidewall portion of the boron and carbon film can be maintained after being exposed to one or more plasma processes, such as a plasma post-deposition treatment process as described herein.

One or more process parameters for boron and carbon (B,C) film growth process may be adjusted to achieve a desired boron and carbon film characteristic. For example, selection of a boron reactant, a duration of a reactant pulse, a duration of a purge step, a process temperature, and/or a number of repetitions of the reactant pulse, may be determined to provide a boron and carbon film comprising desirable characteristics. In some embodiments, one or more parameters of one cycle of a reactant pulse and purge step can be different from that of another cycle (e.g., one cycle of the reactant pulse and purge step as described with reference to FIG. 1). In some embodiments, a boron reactant can have a B—C bond. In some embodiments, a boron reactant comprises at least one organic ligand, such as a hydrocarbon ligand, including a boron reactant comprising an alkyl group.

Figure 2:
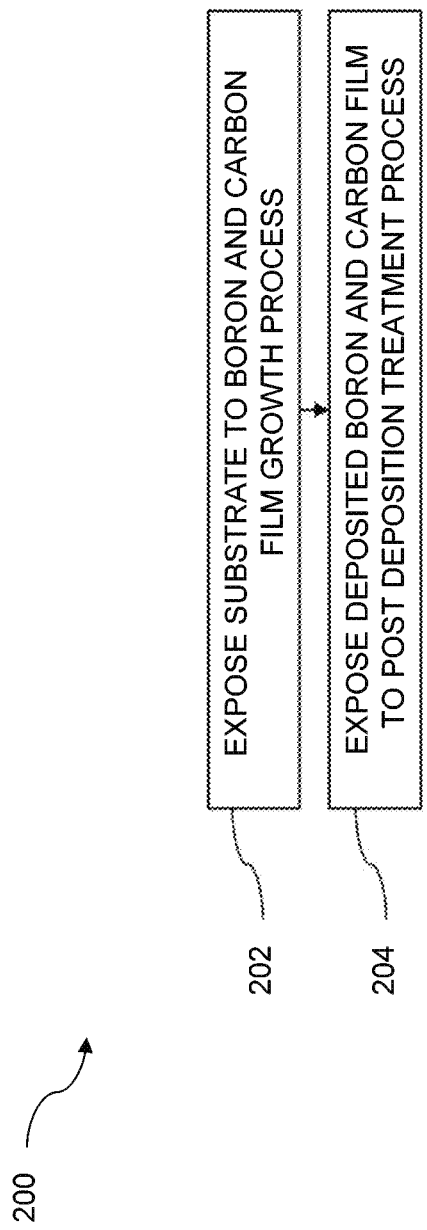
FIG. 2 shows a flow chart of another example of a process for depositing a boron and carbon film, according to an embodiment.

FIG. 2 shows a flow chart 200 of another example of a process for forming boron and carbon (B,C) films, according to some embodiments. In block 202, the substrate is exposed to a boron and carbon film growth process. The boron and carbon film growth process may comprise a deposition process, such as a pulsed thermal CVD process, for depositing a boron and carbon film of a desired thickness and/or composition. For example, the boron and carbon film growth process may comprise repeating a number of times a cycle comprising a reactant pulse followed by a purge step (e.g., the reactant pulse and purge step as described with reference to FIG. 1). The cycle may be repeated a number of times to achieve a desired boron and carbon film thickness and/or composition.

In block 204, a post-deposition treatment process can be carried out on the deposited boron and carbon film. In some embodiments, the post-deposition treatment process comprises a plasma process. For example, the treatment process may comprise contacting the deposited boron and carbon film with one or more energized species for a duration of time. In some embodiments, the post-deposition treatment process comprises contacting the substrate comprising the boron and carbon film with a plasma. For example, the substrate can be contacted with a plasma generated using nitrogen-containing compounds (e.g., nitrogen gas), a noble gas, and/or oxygen-containing compounds (e.g., oxygen gas and/or ozone). In some embodiments, the post-deposition treatment process can be followed by a purge step. For example, the purge step may include flow of nitrogen gas and/or one or more noble gases. In some embodiments, purging the reactor chamber subsequent to the post-deposition treatment process can include turning off the plasma power while continuing to flow one or more of the gases used to generate the plasma for the post-deposition treatment process. For example, during the purge step the one or more gases used in generating the plasma for the post-deposition treatment process may continue to be flowed into the reactor while the plasma power is turned off, the flow rate of the one or more gases during the purge step being the same as or different from that during the post-deposition treatment process.

In some embodiments, exposing a boron and carbon film to a post-deposition treatment process can facilitate a further reduced etch rate of the treated boron and carbon film, for example as compared to that of a boron and carbon film formed without performing the post-deposition treatment process. Without being limited by any particular theory or mode of operation, exposing a boron and carbon film to a post-deposition treatment process as described herein may increase the density of the boron and carbon film, thereby providing a treated boron and carbon film exhibiting decreased etch rate as compared to an untreated boron and carbon film. In some embodiments, the etch rate of a portion of the boron and carbon film deposited on a sidewall of a three-dimensional structure can demonstrate a uniform or substantially uniform etch rate as a portion of the boron and carbon film deposited on a top surface of the structure subsequent to exposure of the boron and carbon film to a post-deposition treatment process (e.g., etch rate uniformity between a top portion and a sidewall portion of the boron and carbon film can be maintained subsequent to exposure to a plasma process of the post-deposition treatment process, such as compared to that of the film prior to the post-deposition treatment process). For example, a ratio of an etch rate of a sidewall portion of the boron and carbon film to an etch rate of a top surface portion of the boron and carbon film subsequent to a post-deposition treatment process can be less than about 4, including less than about 2, about 1.5. In some embodiments, the ratio is about 1.

As described herein, in some embodiments, a post-deposition treatment process may comprise contacting a deposited boron and carbon film with a nitrogen-containing plasma (e.g., contacting the deposited boron and carbon film with nitrogen-containing radicals and/or ions). One or more nitrogen-containing compounds may be used to generate the nitrogen-containing plasma, such as nitrogen-containing compounds which do not have hydrogen (H). For example, the post-deposition treatment process may comprise energetic species generated using nitrogen gas ($N_2$).

In some embodiments, the post-deposition treatment process comprises exposing the boron and carbon film to the nitrogen-containing plasma for a duration of about 1 to about 500 seconds (s), 10 s to about 300 s, including about 10 s to about 100 s, or about 10 s to about 50 s. The nitrogen-containing plasma post-deposition treatment process may be performed at a process temperature of about 100° C. to about 500° C., including about 200° C. to about 500° C., and about 200° C. to about 400° C., and a pressure of about 0.1 Torr to about 20 Torr, including about 1 Torr to about 10 Torr, and about 1 Torr to about 8 Torr. In some embodiments, a plasma power for generating the nitrogen-containing plasma can be about 50 Watts (W) to about 2000 W, including about 50 W to about 1000 W, about 100 W to about 400 W, and about 200 W to about 400 W.

In some embodiments, a post-deposition treatment process comprises contacting a deposited boron and carbon film with a noble gas-containing plasma (e.g., contacting the deposited boron and carbon film with noble gas-containing radicals and/or ions). For example, the post-deposition treatment process may comprise a plasma comprising energetic species generated using helium (He) gas, argon gas (Ar) and/or neon (Ne) gas. In some embodiments, the post-deposition treatment process comprises exposing the boron and carbon film to the noble gas-containing plasma for a duration of about 10 seconds (s) to about 300 s, including about 10 s to about 100 s. The noble gas-containing plasma post-deposition treatment process may be performed at a process temperature of about 100° C. to about 500° C., including about 200° C. to about 500° C., and about 200° C. to about 400° C., and a pressure of about 0.1 Torr to about 20 Torr, including about 1 Torr to about 10 Torr, and about 1 Torr to about 8 Torr. In some embodiments, a plasma power for generating the noble gas-containing plasma can be about 50 Watts (W) to about 2000 W, including about 50 W to about 1000 W, about 100 W to about 400 W, and about 200 W to about 400 W.

In some embodiments, the post-deposition treatment process comprises contacting a deposited boron and carbon film with an oxygen-containing (O) plasma (e.g., contacting the deposited boron and carbon film with oxygen-containing radicals and/or ions). In some embodiments, the oxygen-containing plasma can be generated using oxygen-containing compounds, such as oxygen gas ($O_2$) and/or ozone ($O_3$). In some embodiments, the post-deposition treatment process may comprise exposing the boron and carbon film to the oxygen-containing plasma for a duration of about 10 seconds (s) to about 300 s, including about 10 s to about 100 s. The oxygen-containing plasma post-deposition treatment process may be performed at a process temperature of about 100° C. to about 500° C., including about 200° C. to about 500° C., and about 200° C. to about 400° C., and a pressure of about 0.1 Torr to about 20 Torr, including about 1 Torr to about 10 Torr, and about 1 Torr to about 8 Torr. In some embodiments, a plasma power for generating the oxygen-containing plasma can be about 50 Watts (W) to about 2000 W, including about 50 W to about 1000 W, about 100 W to about 400 W, and about 200 W to about 400 W.

In some embodiments, the oxygen-containing plasma (e.g., generated using oxygen gas and/or ozone) post-deposition treatment process can increase a refractive index of the boron and carbon film. In some embodiments, the oxygen-containing plasma post-deposition treatment process can reduce a thickness of the boron and carbon film (e.g., a thickness of the treated film can be less than a thickness of the film prior to being exposed to the post-deposition treatment process). Without being limited by any particular theory or mode of operation, exposing a boron and carbon film to an oxygen-containing plasma may facilitate replacement of hydrogen (H) and/or carbon (C) components of the film with oxygen (O), for example generating a $BO_x$ containing film. Further without being limited by any particular theory or mode of operation, a change in composition of the boron and carbon film, such as the replacement of hydrogen (H) and/or carbon (C) components of the film with oxygen (O), may be reflected by a decrease in a refractive index of the film, and/or a decrease in film thickness (e.g., due to an increased film density and/or removal of volatile $BO_x$ species). For example, exposure of the boron and carbon film to an oxygen-containing plasma under certain conditions may result in complete or substantially complete removal of the deposited boron and carbon film (e.g., a plasma etch of the boron and carbon film).

In some embodiments, a post-deposition treatment process can be performed once subsequent to depositing a boron and carbon film of a desired thickness and/or composition. In some embodiments, a post-deposition treatment process can be carried out at intervals after every repetition of a number of cycles of a deposition process for depositing the boron and carbon film (e.g., after a number of repetitions of a cycle of the reactant pulse and purge step as described with reference to FIG. 1). For example, a post-deposition treatment process may be performed after every 1, 2, 5, 10, 100, 1,000 cycles of a boron and carbon film deposition process. Other numbers of cycles may also be suitable. In some embodiments, a ratio of a number of cycles of a process for depositing a boron and carbon film (e.g., a ratio of Y:X) to a number of cycles of the post-deposition treatment process for forming a boron and carbon film having desired characteristics can be about 5,000:1 to about 1:1, including about 2,000:1 to about 50:1. In some embodiments, the ratio of the number of cycles for the process of depositing a boron and carbon film to the number of cycles of the post-deposition treatment process can be about 1,500:1 to about 1:1, including about 1,000:1 to about 1:1, about 500:1 to about 1:1, about 100:1 to about 1:1, about 50:1 to about 1:1, and about 20:1 to about 1:1.

In some embodiments, one or more parameters of the post-deposition treatment process may be adjusted to facilitate formation of a boron and carbon film having desirable characteristics. For example, a duration, plasma power, pressure, plasma composition and/or the number of repetitions of the process, may be selected to facilitate producing a boron and carbon film having desired etch characteristics.

A suitable reaction chamber for one or more boron and carbon (B,C) film deposition processes described herein may be part of a cluster tool in which a variety of different processes in the formation of an integrated circuit are carried out. In some embodiments, one or more boron and carbon film deposition processes described herein can be performed in a batch reactor, including for example in a mini-batch reactor (e.g., a reactor having a capacity of eight substrates or less) and/or a furnace batch reactor (e.g., a reactor having a capacitor of fifty or more substrates). In some embodiments, one or more boron and carbon film deposition processes described herein can be performed in a single wafer reactor. In some embodiments, a spatial reactor chamber may be suitable. In some embodiments, a reactor chamber having a cross-flow configuration can be suitable (e.g., a reactor chamber configured to provide gas flow parallel or substantially parallel to a substrate surface positioned in the reactor chamber). In some embodiments, a reactor chamber having a showerhead configuration can be suitable (e.g., a reactor chamber configured to provide gas flow perpendicular or substantially perpendicular to a substrate surface positioned in the reactor chamber).

Exemplary single wafer reactors are commercially available from ASM America, Inc. (Phoenix, Ariz.) under the tradenames Pulsar® 2000 and Pulsar® 3000 and ASM Japan K.K (Tokyo, Japan) under the tradename Eagle® XP and XP8. Exemplary batch ALD reactors are commercially available from and ASM Europe B.V (Almere, Netherlands) under the tradenames A400™ and A412™.

Examples of B,C Films

Figure 3:
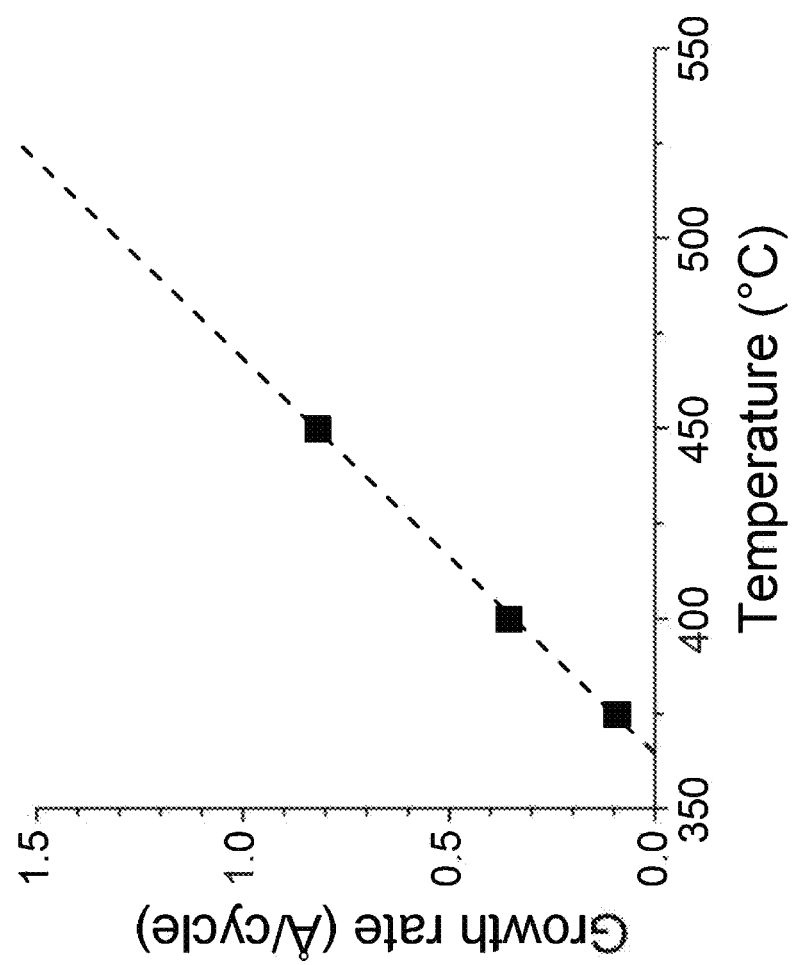
FIG. 3 is a graph of the growth rates of boron and carbon films versus process temperatures according to an embodiment.

FIG. 3 is a graph of the growth rates of boron and carbon (B,C) films deposited according to some embodiments, in angstroms per cycle (Å/cycle), versus process temperature, in degrees Celsius. The boron and carbon films (B,C) of FIG. 3 were deposited using a pulsed thermal CVD process in a Pulsar® 3000 reactor chamber having a cross-flow configuration. One cycle of the pulsed thermal CVD process included a reactant pulse having a duration of about 0.5 s followed by a purge step having a duration of about 5 s. The reactant pulse included supplying TEB and nitrogen gas into the reactor chamber. The TEB was supplied into the reactor chamber using a vapor draw method by providing vaporized TEB from a source container maintained at a temperature of about 20° C. The pressure of the reactor chamber during the reactant pulse was maintained at about 0.1 Torr to about 10 Torr. The purge step included flowing of nitrogen gas through the reactor chamber. Growth rates of boron and carbon films deposited according to the pulsed thermal CVD process were measured at process temperatures of about 375° C., about 400° C. and about 450° C. As shown in FIG. 3, the growth rate of the boron and carbon film per cycle increased with increasing process temperature. As shown in FIG. 3, a boron and carbon film deposited using such a pulsed thermal CVD process can have a linear or substantially linear relationship with the process temperature.

Composition of boron and carbon (B,C) films deposited according to the process described with reference to FIG. 3 at a process temperature of about 400° C. was measured by rutherford backscattering spectrometry (RBS), and was found to have a boron and carbon stoichiometry of about $B_{0.608}C_{0.392}$, or $B_{1.5}C$. The refractive index of boron and carbon films deposited according to the process described with reference to FIG. 3 at a process temperature of about 400° C. was measured by spectroscopic ellipsometry. The refractive index was found to be about 1.98 at a wavelength of about 633 nanometers (nm). Wet etch rate performance in dilute hydrofluoric acid solution (e.g., 0.5 weight % aqueous HF solution) of films deposited according to the process described with reference to FIG. 3 at a process temperature of about 400° C. were measured and was found to be surprisingly resistant to the dilute HF solution. It was found that the wet etch rate in dilute HF solution was negligible, for example after up to about 10 minutes exposure to the dilute HF solution (e.g., a dHF dip of up to about 10 minutes). In some embodiments a negligible etch rate is observed up to about a 30 minute exposure or longer. It was found that the wet etch rate of these films in dilute hydrofluoric acid solution is less than 0.3× that of thermal silicon oxide (TOX).

Figure 4:
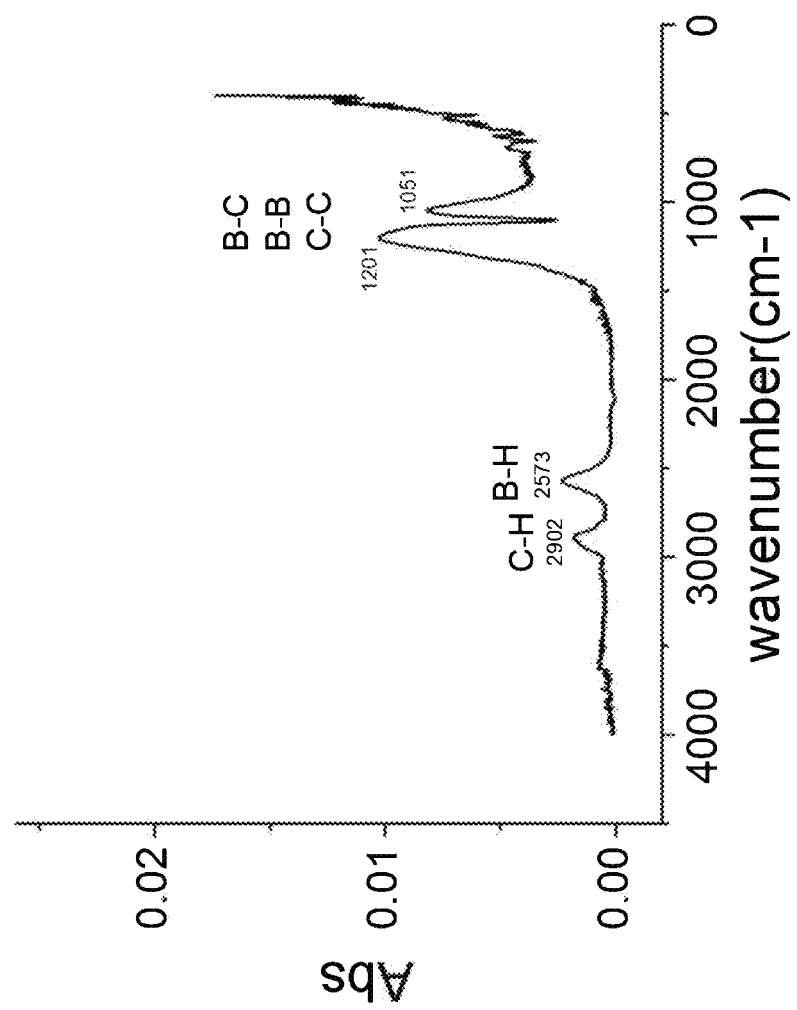
FIG. 4 is a graph showing fourier transform infrared spectroscopy (FTIR) spectra of a boron and carbon film, deposited according to one embodiment.

FIG. 4 shows fourier transform infrared spectroscopy (FTIR) analysis of boron and carbon (B,C) films deposited according to the process described with reference to FIG. 3 at a process temperature of about 400° C. The FTIR analysis shows presence of C—H, B—H, B—C, B—B and C—C bonds in the boron and carbon films. For example, the peak at about 2902 $cm^{-1}$ can be attributed to C—H bonds, and the peak at about 2573 $cm^{-1}$ can be attributed to B—H bonds in the film. The peaks at 1201 $cm^{-1}$ and 1051 $cm^{-1}$ indicate presence of B—C, B—B and C—C bonds.

Boron and carbon (B,C) films were deposited on blanket wafers having a diameter of about 300 millimeters (mm) upon using the process as described with reference to FIG. 3 at a process temperature of about 400° C. The deposition was performed in a Pulsar® 3000 reactor chamber having a cross-flow configuration. A mean film thickness was measured at about 35.58 nm after application of 1,000 cycles of the pulsed thermal CVD process of FIG. 3. The deposited boron and carbon film showed increased thickness toward the center of the wafer, for example as compared to the edge of the wafer, such as the leading edge of the wafer (e.g., a portion of the wafer edge further away from the wafer notch). Without being limited by any particular theory or mode of operation, such a thickness profile may indicate a surface reaction limited growth mechanism, and the thickness variations may be due to temperature variations of the susceptor on which the wafer was positioned. A surface reaction limited growth can advantageously facilitate improved film conformality performance for deposition of boron and carbon films upon 3-D features.

Boron and carbon (B,C) films were deposited on blanket wafers in a Pulsar® 3000 reactor chamber having a cross-flow configuration at a process temperature of about 450° C. The mean thickness of the deposited boron and carbon film was about 81.88 nm after application of 1,000 cycles of the pulsed thermal CVD process of FIG. 3. As compared to the boron and carbon film deposited at about 400° C., the films deposited at about 450° C. demonstrated an increased thickness. The deposited boron and carbon films had an increased thickness closer to the leading edge of the blanket wafer, for example as compared to the boron and carbon films deposited at 400° C. Without being limited by any particular theory or mode of operation, an increased thickness proximate to the leading edge may indicate a mass-transport limited film growth mechanism, versus a surface reaction limited growth mechanism.

Figure 5B:
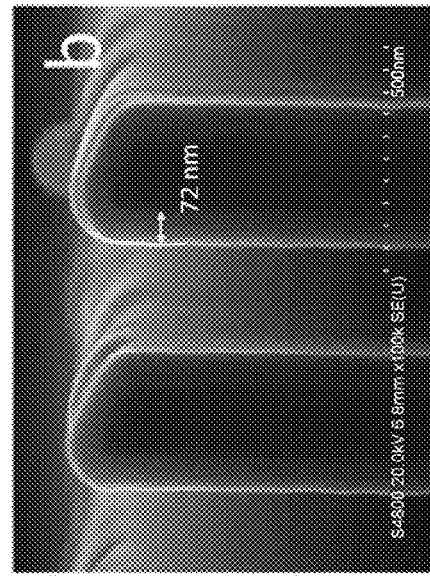
FIGS. 5A-5D are SEM images of a boron and carbon film deposited on a high aspect ratio trench structure.
Figure 5D:
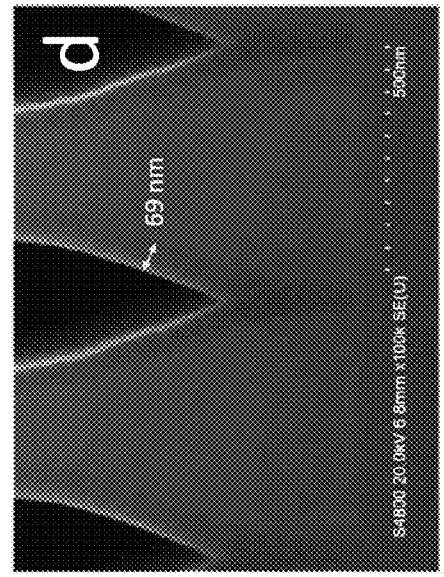
Figure 5A:
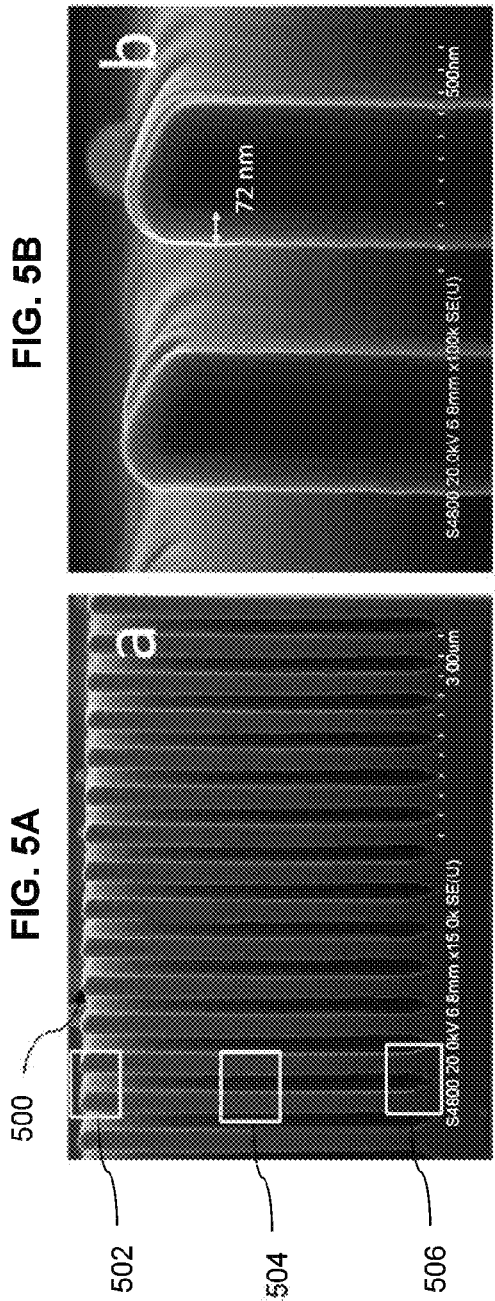
Figure 5C:
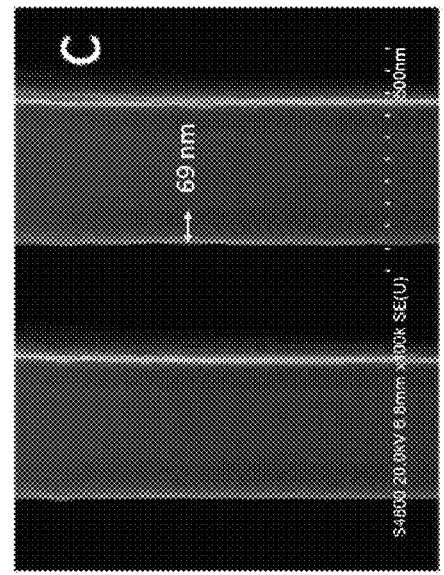

FIGS. 5A-5D are scanning electron microscopy (SEM) images showing cross-section views of a boron and carbon (B,C) film deposited on a high aspect ratio trench structure 500 using the deposition process as described with reference to FIG. 3. The boron and carbon film was deposited with a process temperature of about 400° C., in a Pulsar® 3000 reactor chamber, and by applying 1,500 cycles of the reactant pulse followed by the purge step as described with reference to FIG. 3. FIG. 5A shows, at 15 k× magnification, a SEM image of the high aspect ratio trench structure 500. FIG. 5B shows, at 100 k× magnification, a SEM image of an upper portion 502 of the high aspect ratio trench structure 500. FIG. 5C shows, at 100 k× magnification, an SEM image of a mid-section 504 of the high aspect ratio trench structure 500, and FIG. 5D shows, at 100 k× magnification, a SEM image of a lower portion 506 of the high aspect ratio trench structure 500. A thickness of the deposited boron and carbon film in each of the upper, mid and lower portions of the high aspect ratio trench structure are shown in FIGS. 5B, 5C and 5D, respectively. As shown in FIG. 5, a relatively uniform film thickness was achieved on sides of the high aspect ratio trench structure at the upper, mid and lower portions of the trench structure, for example demonstrating the improved conformality of the deposited boron and carbon film. For example, a film thickness of about 72 nm was measured in the upper portion 502 of the high aspect ratio trench structure 500, a film thickness of about 69 nm was measured at a mid-section 504 of the trench structure 500, and a film thickness of about 69 nm was measured at a lower portion 506 of the trench structure 500, for example demonstrating that a conformality of greater than or equal to about 95% was achieved. Without being limited by any particular theory or mode of operation, deposition of the boron and carbon film at a process temperature of about 400° C. or lower may facilitate deposition of the film in a surface reaction limited regime, facilitating improved conformality of the deposited film.

Boron and Carbon Containing Silicon Nitride Films

As described herein, silicon nitride films can be deposited that include boron and carbon components, and silicon nitride films comprising boron and carbon components can have a wide variety of applications, including applications in semiconductor device fabrication. Deposition of silicon nitride based films having desired characteristics using atomic layer deposition (ALD) at reduced temperatures (e.g., at temperatures of less than about 500° C.), for example to provide processes with reduced thermal budgets, can be difficult. Silicon nitride based films deposited by conventional processes at lower process temperatures may provide films having poor film quality, poor film conformality to three-dimensional (3-D) structures upon which the silicon nitride based film is deposited, undesirably high dry etch rates, and/or undesirably low etch selectivity (e.g., etch selectivity to another material in a semiconductor device, including a thermal silicon oxide material, such that the silicon nitride film may withstand one or more subsequent thermal silicon oxide etch steps used in the device fabrication process).

The formula of a silicon nitride film is generally referred to herein as SiN for convenience and simplicity. However, the skilled artisan will understand that the actual formula of the silicon nitride can be $SiN_x$, where x varies from about 0.5 to about 2.0, as long as some Si—N bonds are formed. In some cases, x preferably varies from about 0.9 to about 1.7, more preferably from about 1.0 to about 1.5, and most preferably from about 1.2 to about 1.4. Generally silicon nitride where Si has an oxidation state of +IV is formed and the amount of nitride in the material might vary.

The formula of a silicon nitride film comprising boron and carbon components is generally referred to herein as SiN(B, C) for convenience and simplicity. However, the skilled artisan will understand that the actual formula of the SiN(B,C) can be $SiN_x(B_y,C_z)$. In some embodiments, for example, x can vary from about 0.5 to about 3.0, as long as some Si—N bonds are formed. In some cases, x preferably varies from about 1.0 to about 2.0, and more preferably from about 1.3 to about 1.8. In some embodiments, y can be between about 0.1 to about 5.0, including preferably from about 0.3 to about 3.0, and more preferably from about 0.5 to about 1.5. For example, y can be about 1.5. In some embodiments, z can be from about 0.1 to about 5.0, including preferably from about 0.2 to about 2.5, and more preferably from about 0.3 to about 1.3. For example, z can be about 1.0.

One or more methods described herein can include an atomic layer deposition (ALD) process and/or a chemical vapor deposition (CVD) process and can be used to form a silicon nitride based film, such as a silicon nitride film comprising boron and carbon components SiN(B,C). In some embodiments, the silicon nitride films comprising boron and carbon components have one or more of improved conformal coverage of three-dimensional (3-D) features, a desirable dry etch rate, a desirable wet etch rate, and/or a desirable etch selectivity with respect to another material (e.g., a thermal silicon oxide layer (TOX) in a semiconductor device). For example, a silicon nitride film including boron and carbon components (e.g., for applications such as spacer material of gate features in semiconductor transistors, including multi-gate transistors such as FinFETs) deposited according to one or more processes described herein can demonstrate improved step coverage, reduced etch rate in a wet etchant (e.g., resistance against wet etchant, such as a dilute hydrofluoric acid (HF or dHF) solution, such as a 0.5 weight % HF solution), and/or a reduced wet etch ratio with respect to a thermal silicon oxide material (e.g., a ratio of a wet etch rate of the silicon nitride based film to a wet etch rate of the thermal silicon oxide material of less than about 1, including less than about 0.5). In some embodiments, a silicon nitride film including boron and carbon components can have a desirable dielectric constant (κ-value), for example a dielectric constant of less than about 7, including less than about 6, and less than about 5.5. For example, a silicon nitride film including boron and carbon components may have a dielectric constant between about 4.8 and about 6, including between about 4.8 and about 5.5.

In some embodiments, a silicon nitride ALD deposition process can be used to deposit a silicon nitride (SiN) film of a desired thickness and composition. ALD type processes are based on controlled, self-limiting surface reactions. Gas phase reactions are avoided by contacting the substrate alternately and sequentially with reactants. Vapor phase reactants are separated from each other in the reaction chamber, for example, by removing excess reactants and/or reactant byproducts from the reaction chamber between reactant pulses. For example, the ALD deposition process can include contacting a substrate with a silicon reactant such that the silicon reactant adsorbs on the substrate surface, and subsequently contacting the substrate with a nitrogen reactant. A silicon reactant may comprise silicon-containing compounds which can contribute silicon to the growth of the silicon nitride film. A nitrogen reactant may comprise nitrogen-containing compounds which can contribute nitrogen to the growth of the silicon nitride film. Exposure of the substrate to the silicon reactant and the nitrogen reactant can be repeated as many times as required to achieve a film of a desired thickness and composition. Excess reactants may be removed from the vicinity of the substrate, for example by purging from the reaction space with an inert gas, after each contacting step. For example, the reactor chamber may be purged between reactant pulses. The flow rate and time of each reactant, is tunable, as is the purge step, allowing for control of the dopant concentration and depth profile in the film. In some embodiments, the substrate can be moved to a space free or substantially free of reactants prior to purging the reactor chamber of the excess reactants and/or reaction byproducts.

In some embodiments, an ALD process for depositing the silicon nitride (SiN) film can include one or more cycles, each cycle comprising at least two distinct processes or phases. The provision and removal of a reactant from the reaction space may be considered a phase. In a first process or phase, a first reactant comprising silicon is provided and forms no more than about one monolayer on the substrate surface. This reactant is also referred to herein as "the silicon precursor" or "silicon reactant." In a second process or phase, a second reactant comprising a nitrogen-containing compound is provided and reacts with the adsorbed silicon precursor to form SiN. This second reactant may also be referred to as a "nitrogen precursor" or "nitrogen reactant." As described herein, the second reactant may comprise ammonia ($NH_3$) and/or another suitable nitrogen-containing compound. Additional processes or phases may be added and phases may be removed as desired to adjust the composition of the final film. In some embodiments for depositing a silicon nitride (SiN) film, one or more deposition cycles typically begins with provision of the silicon precursor followed by the nitrogen precursor. In some embodiments, one or more deposition cycles begins with provision of the nitrogen precursor followed by the silicon precursor. One or more of the reactants may be provided with the aid of a carrier gas, such as nitrogen ($N_2$), argon (Ar) and/or helium (He).

In some embodiments, a process for depositing a silicon nitride film comprising boron and carbon components (SiN(B,C)) having desirable characteristics can include a hybrid process comprising both an ALD process and a CVD process. For example the process for forming a silicon nitride film comprising boron and carbon components can comprise an ALD portion for depositing silicon nitride and a CVD portion for incorporating boron and carbon components into the growing film. The silicon nitride and boron and carbon components may in some embodiments form a continuous film in which the silicon nitride and boron and carbon components do not form distinct layers or substantially do not form distinct layers.

In some embodiments, no plasma is used in the deposition of the silicon nitride film comprising boron and carbon components. For example, a process for depositing the silicon nitride film comprising boron and carbon components can include both a thermal ALD process and a thermal CVD process, including a pulsed thermal CVD process. In some embodiments, plasma of a nitrogen precursor is used in the ALD process for depositing the silicon nitride. For example, a PEALD process comprising plasma for a nitrogen precursor may be used for depositing silicon nitride, and the PEALD process may be combined with a thermal CVD process for incorporating boron and carbon components into the silicon nitride.

In some embodiments, the process for depositing a silicon nitride film comprising boron and carbon components (SiN(B,C)) can include an ALD process for depositing a silicon nitride (SiN) film (e.g., an ALD process comprising alternately and sequentially contacting the substrate with a silicon reactant, for example comprising octachlorotrisilane ($Si_3Cl_8$, OCTS), and a nitrogen reactant, for example comprising ammonia ($NH_3$)), and a decomposition process in which one or more boron reactants decomposes on the substrate surface for introducing the boron and carbon components into the silicon nitride film (e.g., a CVD process using one or more boron reactants, for example comprising triethylboron ($B(C_2H_5)_3$, TEB, in which the TEB decomposes). In some embodiments, the ALD process for depositing the SiN film can include contacting the substrate with a silicon reactant comprising hexachlorodisilane ($Si_2Cl_6$, HCDS). In some embodiments, the CVD process for introducing boron and carbon components can include contacting the substrate with a boron reactant comprising trialkylboron, such as trimethylboron ($B(CH_3)_3$, TMB or triethylboron (TEB)). In some embodiments, excess reactants and/or reaction by products can be removed by a purge step after each process (e.g., a purge step can be performed after a silicon reactant pulse, a nitrogen reactant pulse and/or a boron reactant pulse). For example, excess silicon reactants and/or reaction byproducts can be removed from the reaction space prior to introducing the nitrogen reactants, such that the nitrogen reactant reacts with the adsorbed silicon reactant to form a monolayer of silicon nitride on the substrate. In some embodiments, the substrate can be moved to a space free or substantially free of reactants prior to purging the reaction space.

In some embodiments a pulsed CVD process is used for the decomposition process. In some embodiments a pulsed CVD process is used in which multiple short pulses of the boron reactant are provided. In some embodiments a single, longer pulse of the boron reactant is provided. In some embodiments the conditions are selected such that under the same conditions the SiN is formed from surface reactions (ALD) while the boron reactant decomposes (CVD). In some embodiments, a pulsed CVD process for introducing boron and carbon components into the SiN film facilitates integration of the boron carbon process. In some embodiments, a pulsed CVD process for introducing boron and carbon components into the SiN film facilitates increased control in the quantity of boron and carbon components incorporated into the SiN film. In some embodiments, the boron reactant can also be provided under ALD conditions.

According to some embodiments of the present disclosure, the pressure of the reaction chamber during processing is maintained at about 0.01 Torr to about 50 Torr, preferably from about 0.1 Torr to about 10 Torr.

One or more parameters of the process for depositing the silicon nitride film and/or the process for introducing the boron and carbon components can be adjusted to provide a film having desired characteristics. For example, a flow rate of one or more boron reactants, and/or a process temperature, of a CVD process for introducing the boron carbon and components can be adjusted. For example, a duration of a reactant pulse for providing one or more boron reactants in a pulsed CVD process can be adjusted. In some embodiments, one or more parameters of the ALD process for depositing the SiN film can be adjusted, such as a process temperature, a reactor chamber pressure, and/or a reactant exposure duration.

In some embodiments, the process for depositing a silicon nitride film comprising boron and carbon components can include one or more cycles of the process for providing the silicon nitride SiN film (e.g., repetitions of the SiN process), and/or one or more cycles of the process for introducing the boron and carbon components (e.g., repetitions of the boron carbon process). In some embodiments, the number of repetitions of the SiN process and the boron carbon process can be tuned to provide a film of desirable characteristics. In some embodiments, the ratio of the number of repetitions of the SiN process to the number of repetitions of the boron carbon process is selected to give a desired film composition. In some embodiments, the SiN process cycle is repeated 2, 3, 4, 5, 6, 7, 8, 9, 10, or more times, for each boron carbon process cycle. In some embodiments, a number of repetitions of the SiN process cycle is followed by a number of repetitions of the boron carbon process cycle, where the number of repetitions of the SiN process cycle is different from the number of repetitions of the boron carbon process cycle.

In some embodiments, a process for depositing a silicon nitride film comprising boron and carbon components can include a sequence comprising a number of repetitions of an ALD process for deposition of the silicon nitride SiN film and/or a number of repetitions of a CVD process for introducing the boron and carbon components, the number of repetitions of each of the ALD process, the CVD process, and/or the total number of repetitions in the sequence of both the ALD process and CVD process being selected to provide a film having desired characteristics and/or a desired boron and carbon components composition. For example, a boron and carbon content may be adjusted to provide a film having a desired etch performance (e.g., a wet etch rate and/or a dry etch rate), and/or conformality performance. In some embodiments, the number of repetitions of the CVD process can be selected based on one or more parameters of the CVD process and/or the ALD process. In some embodiments, the number of repetitions of the ALD process can be selected based on one or more parameters of the ALD process and/or the CVD process. In some embodiments, the sequence including the number of repetitions of the ALD process cycle and the number of repetitions of the CVD process cycle can be repeated to provide a film of a desired composition and/or thickness.

In some embodiments, the process for depositing a silicon nitride film comprising boron and carbon components does not include a plasma enhanced process. That is, no plasma is used during the entire process. For example, the process can include both a thermal ALD process and a pulsed thermal CVD process (e.g., thermal decomposition of one or more boron reactants, such as decomposition of TEB).

Figure 6:
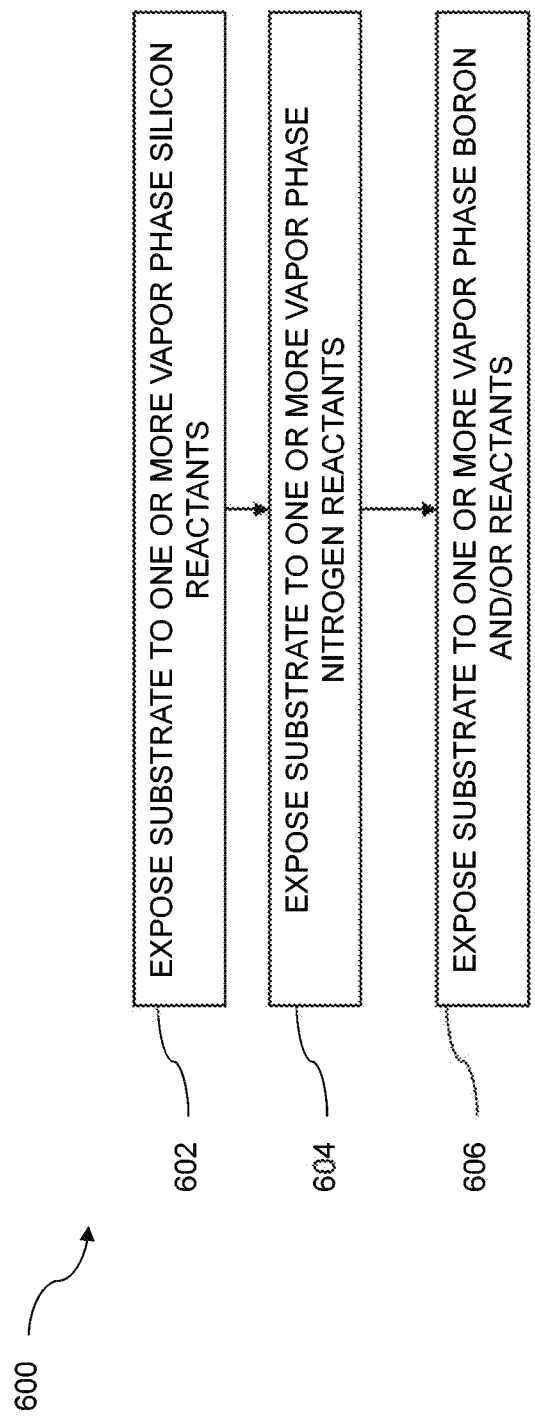
FIG. 6 shows a flow chart of an example of a process for depositing a silicon nitride film comprising boron and carbon, according to an embodiment.

FIG. 6 is a flow chart of an example of a process flow 600 for forming a silicon nitride film comprising boron and carbon components (e.g., a SiN(B,C) film). In block 602, a substrate can be exposed to one or more vapor phase silicon reactants (e.g., one or more silicon precursors). A layer of silicon reactant is formed on the substrate surface. In some embodiments, the one or more vapor phase silicon reactants can adsorb onto a surface of the substrate. In some embodiments the one or more silicon reactants at least partially decomposes at the substrate surface. In block 604, the substrate can be exposed to one or more vapor phase nitrogen reactants (e.g., a nitrogen precursor). For example, the one or more nitrogen reactants may interact with the one or more silicon reactants on the surface of the substrate (e.g., the one or more nitrogen reactants may react with the one or more silicon reactants on the substrate surface to form silicon nitride (SiN)). In block 606, the substrate can be exposed to one or more vapor phase boron reactants (e.g., one or more boron and/or carbon precursors). The one or more boron reactants may react with the silicon nitride on the substrate surface, thus introducing boron and carbon components into the film such that a silicon nitride film comprising boron and carbon components is formed. In some embodiments the one or more boron reactants decomposes on the substrate surface.

In some embodiments, one or more of the reactants may at least partially decompose on the substrate surface. For example, one or more of the silicon, nitrogen or boron reactants is provided under chemical vapor deposition (CVD) conditions.

In some embodiments, a process for exposing a substrate to a silicon reactant, a nitrogen reactant, and/or a boron reactant can include a chemical vapor deposition (CVD) process. In some embodiments, each of exposing a substrate to a silicon reactant, a nitrogen reactant, and a boron reactant can include a CVD process, including for example a pulsed CVD process.

In some embodiments, exposing a substrate to a silicon reactant, a nitrogen reactant, and/or a boron reactant can include a vapor phase deposition process in which one or more reactants decompose to facilitate formation of the SiN (B,C) film.

In some embodiments, the ALD and/or the CVD processes can be a plasma enhanced process (e.g., a direct plasma process and/or a remote plasma process). In some embodiments, the ALD and/or the CVD processes do not include a plasma enhanced process. For example, the ALD process can be a thermal ALD process.

In some embodiments, a process for exposing a substrate to a silicon reactant, a nitrogen reactant, and/or a boron reactant may overlap, or be combined. For example, one or more of the silicon reactant, nitrogen reactant, and/or boron reactant may be provided in pulses that partially or completely overlap.

In some embodiments, a nitrogen-containing gas (e.g., nitrogen gas ($N_2$) and/or ammonia ($NH_3$)) can be fed continuously throughout a process for depositing a SiN(B,C) film (e.g., the nitrogen-containing gas can serve as a carrier gas and/or as a reactant). For example, the nitrogen-containing gas can serve as a carrier gas for reactants in a plasma process (e.g., used for generating a nitrogen-containing plasma). In some embodiments, the nitrogen-containing gas is fed continuously or substantially continuously into the reaction chamber throughout a deposition process, for example including while reactant pulses of a silicon reactant and/or a boron reactant are introduced into the reactor chamber. Nitrogen-containing gas flow rate and/or a concentration of the nitrogen flow can be adjusted during the deposition process, for example, during pulsing of the silicon reactant and/or boron and/or carbon reactant.

A variety of silicon reactants may be suitable. In some embodiments, a suitable silicon reactant in a process for depositing a silicon nitride film can include at least one of silicon halides, silicon alkylamines, silicon amines and/or silanes (e.g., including silanes comprising one or more alkyl groups). For example, a suitable silicon reactant can include a silicon chloride. In some embodiments, a silicon reactant can include a halosilane. In some embodiments, a silicon reactant can include an alkyl silicon compound comprising a halide. In some embodiments, a silicon reactant can be alkyl silane. In some embodiments, a silicon reactant can include octachlorotrisilane ($Si_3Cl_8$, OCTS). In some embodiments, a silicon reactant can include hexachlorodisilane ($Si_2Cl_6$, HCDS).

Suitable nitrogen reactants can include a variety of nitrogen-containing reactants. In some embodiments, a nitrogen reactant can include a hydrogen bonded to a nitrogen (N—H). In some embodiments, a suitable nitrogen reactant can be ammonia ($NH_3$). In some embodiments, a suitable nitrogen reactant can be hydrazine ($N_2H_4$). In some embodiments, a suitable nitrogen reactant can comprise one or more reactive species generated by a nitrogen-containing plasma, including for example nitrogen-containing radicals. In some embodiments, a suitable nitrogen reactant can include nitrogen atoms.

In some embodiments, a suitable boron reactant can include a boron compound having at least one organic ligand. In some embodiments, the organic ligand can have double and/or triple bonds. In some embodiments, the organic ligand can be a cyclic ligand. In some embodiments, the organic ligand can comprise delocalized electrons. In some embodiments, a suitable boron reactant can include trialkylboron compounds. In some embodiments, a suitable boron reactant can include triethylboron ($B(C_2H_5)_3$, TEB). In some embodiments, a suitable boron reactant can include trimethylboron ($B(CH_3)_3$, TMB). In some embodiments, a suitable boron reactant can include trialkylboron compounds having linear or branched alkyl groups, including for example linear or branched $C_3$-$C_8$, and more preferably including linear or branched $C_3$-$C_5$. Suitable boron reactants can include a variety of other boron-containing reactants. In some embodiments, a boron reactant can include a boron halide, an alkylboron, and/or a borane. In some embodiments, a boron reactant can include boron halides, borane halides and complexes thereof. For example, a suitable boron halide can have a boron to halide ratio of about 0.5 to about 1.

Suitable boranes can include compounds according to formula I or formula II.

$$B_nH_{n+x} \qquad \text{(formula I)}$$

Wherein n is an integer from 1 to 10, preferably from 2 to 6, and x is an even integer, preferably 4, 6 or 8.

$$B_nH_m \qquad \text{(formula II)}$$

Wherein n is an integer from 1 to 10, preferably form 2 to 6, and m is an integer different than n, from 1 to 10, preferably from 2 to 6.

Of the above boranes according to formula I, examples include nido-boranes ($B_nH_{n+4}$), arachno-boranes ($B_nH_{n+6}$) and hyph-boranes ($B_nH_{n+8}$). Of the boranes according to formula II, examples include conjuncto-boranes ($B_nH_m$). Also, borane complexes such as $(CH_3CH_2)_3N$—$BH_3$ can be used.

In some embodiments, suitable boron reactants can include borane halides, particularly fluorides, bromides and chlorides. An example of a suitable compound is $B_2H_5Br$. Further examples comprise boron halides with a high boron/halide ratio, such as $B_2F_4$, $B_2Cl_4$ and $B_2Br_4$. It is also possible to use borane halide complexes.

In some embodiments, halogenoboranes according to formula III can be suitable boron reactants.

$$B_nX_n \qquad \text{(formula III)}$$

Wherein X is Cl or Br and n is 4 or an integer from 8 to 12 when X is Cl, or n is an integer from 7 to 10 when X is Br.

In some embodiments, carboranes according to formula IV can be suitable boron reactants.

$$C_2B_nH_{n+x} \qquad \text{(formula IV)}$$

Examples of carboranes according to formula IV include closo-carboranes ($C2B_nH_{n+2}$), nido-carboranes ($C_2B_nH_{n+4}$) and arachno-carboranes ($C_2B_nH_{n+6}$).

In some embodiments, amine-borane adducts according to formula V can be suitable boron reactants.

$$R_3NBX_3 \qquad \text{(formula V)}$$

Wherein R is linear or branched C1 to C10, preferably C1 to C4 alkyl or H, and X is linear or branched C1 to C10, preferably C1 to C4 alkyl, H or halogen.

In some embodiments, aminoboranes where one or more of the substituents on B is an amino group according to formula VI can be suitable boron reactants.

$$R_2N \qquad \text{(formula VI)}$$

Wherein R is linear or branched C1 to C10, preferably C1 to C4 alkyl or substituted or unsubstituted aryl group.

An example of a suitable aminoborane is $(CH_3)_2NB(CH_3)_2$.

In some embodiments, a suitable boron reactant can include a cyclic borazine (—BH—NH—)$_3$ and/or its volatile derivatives.

In some embodiments, alkyl borons or alkyl boranes can be suitable boron reactants, wherein the alkyl is typically linear or branched C1 to C10 alkyl, preferably C2 to C4 alkyl.

In some embodiments, the substrate on which deposition of a silicon nitride film comprising boron and carbon is desired, such as a semiconductor workpiece, is loaded into a reactor chamber. The reactor chamber may be part of a cluster tool in which a variety of different processes in the formation of an integrated circuit are carried out. In some embodiments, one or more deposition processes described herein can be performed in a batch reactor, including for example in a mini-batch reactor (e.g., a reactor having a capacity of eight substrates or less) and/or a furnace batch reactor (e.g., a reactor having a capacitor of fifty or more substrates). In some embodiments, one or more deposition processes described herein can be performed in a single wafer reactor. In some embodiments, a spatial reactor chamber may be suitable (e.g., a spatial ALD reactor chamber). In some embodiments, a reactor chamber having a cross-flow configuration can be suitable. In some embodiments, a reactor chamber having a showerhead configuration can be suitable.

Exemplary single wafer reactors are commercially available from ASM America, Inc. (Phoenix, Ariz.) under the tradenames Pulsar® 2000 and Pulsar® 3000 and ASM Japan K.K (Tokyo, Japan) under the tradename Eagle® XP and XP8. Exemplary batch ALD reactors are commercially available from and ASM Europe B.V (Almere, Netherlands) under the tradenames A400™ and A412™.

Figure 7:
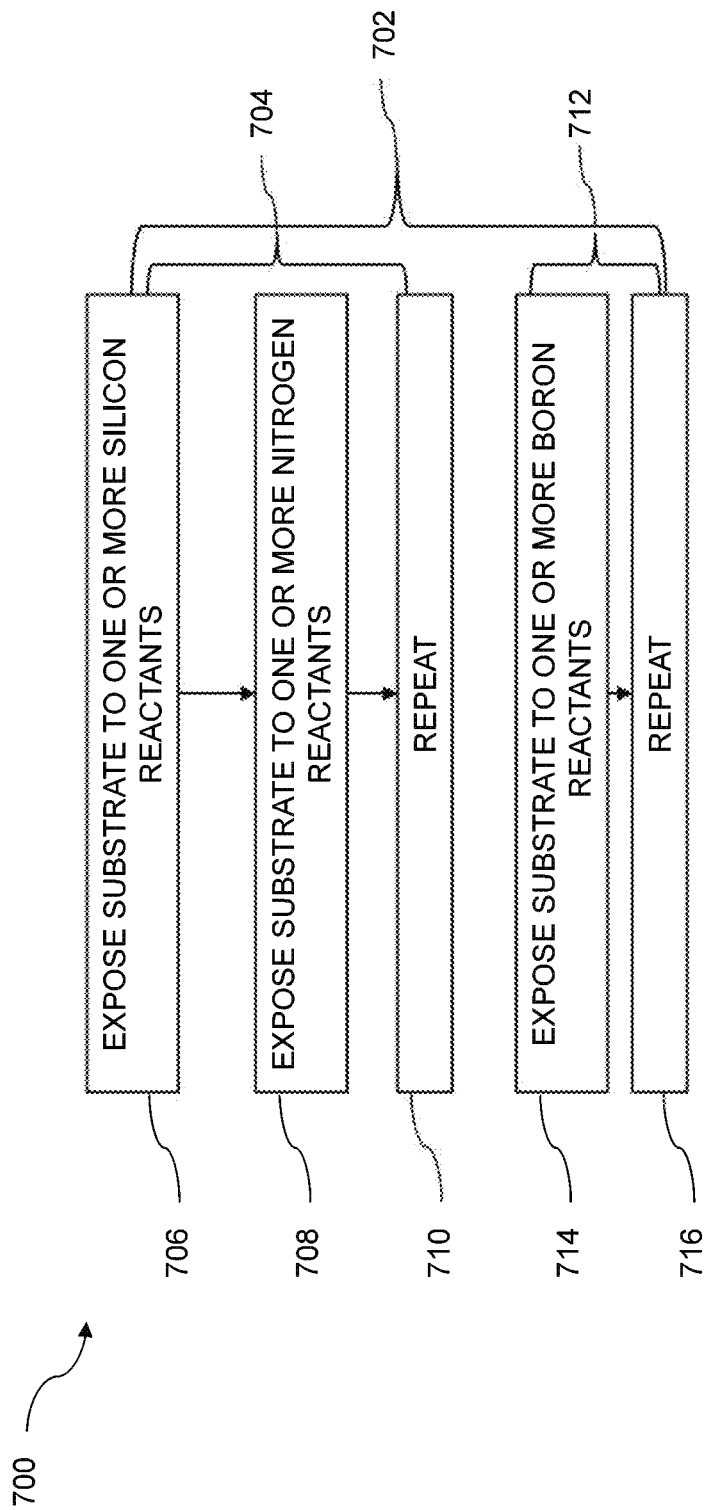
FIG. 7 shows a flow chart of an example of a process for depositing a silicon nitride film comprising boron and carbon, according to another embodiment.

FIG. 7 is a flow chart showing another example of a process 700 for forming a silicon nitride film comprising boron and carbon components (e.g., a SiN(B,C) film). The process 700 can include a sequence 702 having a process 704 for forming silicon nitride on a substrate surface and a process 712 for introducing boron and carbon components into the silicon nitride. In some embodiments, the sequence 702 can be repeated a number of times to form a SiN(B,C) film having a desired composition and/or thickness. The ratio of the number of times process 704 is performed to the number of times the process 712 is performed can be varied to tune the concentration of boron and carbon components in the film and thus to achieve a film with desired characteristics. For example, the number of times process 704 is repeated relative to the number of times the process 712 is repeated can be selected to provide a film with desired boron and carbon components content.

The process 704 for forming silicon nitride on a substrate surface can include blocks 706, 708 and 710. In block 706, the substrate can be exposed to one or more silicon reactants. In block 708, the substrate can be exposed to one or more nitrogen reactants. In block 710, blocks 706 and 708 can be repeated a number of times (e.g., a number of cycles of the process 704). In some embodiments, exposing the substrate to the one or more silicon reactants in block 706 can comprise exposing the substrate to a silicon reactant pulse, and exposing the substrate to the one or more nitrogen reactants in block 708 can comprise exposing the substrate to a nitrogen reactant pulse. In some embodiments, a silicon reactant pulse of block 706 and a nitrogen reactant pulse of block 708 are separated by a purge step (not shown) configured for removing excess silicon reactant and/or reaction byproduct from the reactor chamber. A purge step may comprise flowing of purge gas, and/or evacuating the reactor chamber (e.g., by drawing a vacuum upon the reactor chamber) so as to remove or substantially remove excess reactants and/or reaction byproducts. In some embodiments, excess nitrogen reactant and/or reaction byproducts are removed prior to performing the repetition process in block 710, for example by performing a purge step (not shown) after exposing the substrate to the one or more nitrogen reactants in block 708. In some embodiments, process 704 is an ALD process. In some embodiments, process 704 is a CVD process, where at least one of the reactants at least partially decomposes on the substrate surface. In some embodiments, the pulses of the silicon and nitrogen reactants may at least partially overlap.

The process 712 for introducing boron and carbon components into the silicon nitride can include blocks 714 and 716. In block 714, the substrate can be exposed to one or more boron reactants. In block 716, block 714 can be repeated a number of times (e.g., a number of cycles of the process 712). In some embodiments, exposing the substrate to the one or more boron reactants comprises exposing the substrate to a boron reactant pulse. For example, in block 716, the boron reactant pulse of block 714 can be repeated a number of times. In some embodiments, each boron reactant pulse can be separated by a purge step (not shown) configured to remove excess boron reactants and/or reaction byproducts. In some embodiments, a single boron reactant pulse is provided (e.g., a repetition of process 714 is not performed). The one or more boron reactants are provided under CVD conditions in some embodiments, such that the one or more boron reactants decompose on the substrate surface.

In some embodiments, a process for forming a SiN(B,C) film (e.g., process 700 of FIG. 7) can be a hybrid process including both ALD and CVD processes. For example, a process for forming the silicon nitride (SiN) film (e.g., process 704 of FIG. 7) can include an ALD process, and a process for introducing boron and carbon components into the silicon nitride (SiN) film (e.g., process 712 of FIG. 7, so as to form a SiN(B,C) film) can include a CVD process.

In some embodiments plasma is not used in either of 704 or 712. For example, process 704 and/or 712 can include a thermal process, such as a thermal ALD process and/or a thermal CVD process.

A silicon reactant of an ALD process for providing a silicon nitride film (SiN) may comprise octachlorotrisilane ($Si_3Cl_8$, OCTS) and/or hexachlorodisilane ($Si_2Cl_6$, HCDS), and a nitrogen reactant of the ALD process may comprise ammonia ($NH_3$). Exposing a substrate to the silicon reactant (e.g., block 706 of FIG. 7) can include exposing the substrate to $Si_3Cl_8$ and/or $Si_2Cl_6$. For example, $Si_3Cl_8$ and/or $Si_2Cl_6$ can be fed into a reactor chamber (e.g., a silicon reactant pulse) for a duration of time, including for example with the aid of a nitrogen carrier gas. Exposing the substrate to the nitrogen reactant (e.g., block 708 of FIG. 7) can include exposing the substrate to $NH_3$. For example, $NH_3$ can be fed into a reactor chamber (e.g., a nitrogen reactant pulse) for a duration of time, including for example with the aid of a nitrogen carrier gas. The pulse length for a silicon reactant pulse and/or a nitrogen reactant pulse can be from about 0.05 seconds to about 5.0 seconds, about 0.1 seconds to about 3 seconds or about 0.2 seconds to about 1.0 second. For example, a nitrogen reactant pulse and/or a silicon reactant pulse can be about 1 second.

As described herein, a reactant pulse for delivering one or more reactants into a reactor chamber in an ALD process can be followed by a purge step, such as for removal of an excess reactant and/or a reaction byproduct from the vicinity of the substrate surface. A gas such as nitrogen ($N_2$), argon (Ar) and/or helium (He) can be used as a purge gas to aid in the removal of the excess reactant and/or reaction byproduct. In some embodiments, a purge step of an ALD process can be about 1 second to about 20 seconds, about 1 second to about 15 seconds or about 1 second to about 10 seconds, including about 5 seconds. For example, one cycle of an ALD process for exposing a substrate to a silicon reactant and/or a nitrogen reactant can include a reactant pulse of about 0.5 seconds, followed by a purge step of about 5 seconds. In some embodiments, one cycle of an ALD process can include a silicon reactant pulse of about 0.5 seconds, followed by a purge step of about 5 seconds, followed by a nitrogen reactant pulse of about 0.5 seconds, and then followed by a purge step of about 5 seconds.

A cycle of the ALD process may be repeated a number of times until a film of the desired thickness and/or composition is obtained. In some embodiments the deposition parameters, such as the reactant flow rate, reactant flow duration, purge step duration, and/or reactants themselves, may be varied in one or more deposition cycles during the ALD process in order to obtain a film with the desired characteristics. For example, one or more deposition parameters of an ALD process cycle may be different from that of another ALD process cycle.

As described herein, in some embodiments, a process for depositing a silicon nitride film comprising boron and carbon components (e.g., a SiN(B,C) film) can include a chemical vapor deposition (CVD) process. A CVD process for introducing boron and carbon components into a silicon nitride film can include decomposition of one or more reactants and/or chemical interaction between multiple reactants on the silicon nitride film. For example, a reactant can be fed into a reactor chamber, the decomposition of which facilitates formation of the desired film. In some embodiments, a suitable boron reactant can include triethylboron ($B(C_2H_5)_3$, TEB) and/or trimethylboron ($B(CH_3)_3$, TMB). For example, TEB fed into the reactor chamber may decompose on the silicon nitride film to facilitate introduction of boron and carbon components into the silicon nitride film.

In some embodiments, a pulsed CVD process can be used. In some embodiments, the process for depositing the SiN(B, C) film includes an ALD process configured to provide a silicon nitride SiN film on a substrate surface, and a CVD process performed subsequent to at least one cycle of the ALD process, the CVD process being configured for introducing boron and carbon components into the silicon nitride film so as to form the SiN(B,C) film (e.g., a pulsed CVD process for delivering pulses of one or more boron reactants into the reactor chamber). In some embodiments, the CVD process can be repeated a number of times to provide a SiN(B,C) film having a desired composition (e.g., repeating for a number of times a cycle of a CVD process including a reactant pulse followed by a purge process). In some embodiments, the CVD process for introducing boron and carbon components is not a pulsed CVD process, such that a boron reactant is fed in a continuous or substantially continuous stream into the reactor chamber to achieve a SiN(B,C) film having a desired boron and carbon components content.

A pulsed CVD process can include feeding a reactant gas (e.g., a reactant pulse) into a reactor chamber for a duration of time. In some embodiments, the reactant pulse of a CVD process can have a duration from about 0.05 seconds to about 5.0 seconds, about 0.1 seconds to about 3 seconds or about 0.2 seconds to about 1.0 second. For example, a reactant pulse can be about 0.5 seconds.

In some embodiments, an interval between two reactant pulses can comprise discontinuing flow of the one or more reactants of the reactant pulse. An interval between reactant pulses may have a duration of about 1 second to about 20 seconds, including about 1 second to about 15 seconds, or about 1 second to about 10 seconds. For example, the interval can be about 5 seconds. In some embodiments, the interval comprises transport of the substrate to a space free or substantially free of reactants. In some embodiments, the interval comprises a purge step. For example, the interval may comprise transport of the substrate to a space free or substantially free of reactants, and a purge step. For example, a pulse for delivering one or more reactants into a reactor chamber for a pulsed CVD process can be followed by a purge step, such as for removal of an excess reactant and/or a reaction byproduct from the vicinity of the substrate surface. A purge step can include flow of one or more inert gases through the reactor chamber (e.g., argon (Ar), helium (He), and/or nitrogen ($N_2$)). In some embodiments, each reactant pulse can be followed by a purge step. A purge step can include removal of an excess reactant and/or byproducts from the vicinity of the substrate. In some embodiments, a purge step of a CVD process can have a duration of about 1 second to about 20 seconds, about 1 second to about 15 seconds or about 1 second to about 10 seconds. For example, a purge process can be about 5 seconds. Other durations for the reactant pulse and/or the purge process may also be suitable, as can be determined by the skilled artisan given the particular circumstances.

A suitable duration of time in which a reactant gas is provided into a reactor chamber and/or a duration of a purge step, a gas flow rate in the reactant pulse and/or the purge step, can depend on one or more parameters of the reaction process, for example, adjusting a reactant pulse duration and/or reactant pulse gas flow rate, and/or a purge step duration and/or purge step gas flow rate, such that desired reactants are provided to and/or removed from the vicinity of the substrate surface.

As described herein, a process for depositing a SiN(B,C) film can include a sequence (e.g., sequence 702 of FIG. 7) having a number of repetitions of a process for providing a silicon nitride film, followed by a number of repetitions of a process for introducing boron and carbon components into the silicon nitride film. In some embodiments, the sequence can be repeated for a number of times (e.g., the sequence being repeated Z number of times) to provide a SiN(B,C) film having a desired composition and/or thickness. For example, a process for forming a SiN(B,C) film can include a sequence having a number cycles of an ALD processes for depositing a silicon nitride SiN film followed by a number of cycles of an CVD process for introducing boron and carbon components into the silicon nitride SiN film, the sequence being repeated for a number of times to provide a SiN(B,C) film of a desired composition and/or thickness.

In some embodiments, a sequence, including a number of cycles of an ALD process for depositing a silicon nitride film followed by a number of cycles of a CVD process for introducing boron and carbon components into the silicon nitride film, can be repeated about 1 time to about 150 times, including about 25 times to about 75 times. For example, the sequence can be repeated about 75 times. For example, the sequence can be repeated 100 times.

A number of cycles of a process for providing a silicon nitride (SiN) film (e.g., X cycles of an ALD process, such as repeating a number of times or performing a number of cycles of process 704 of FIG. 7) and/or a number of cycles of a process for introducing boron and carbon components into the silicon nitride (e.g., Y cycles of a CVD process, such as repeating a number of times or performing a number of cycles of process 712 of FIG. 7) in a sequence may be selected to achieve desired film characteristics. For example, a sequence can include a number of cycles of an ALD process followed by a number of cycles of a CVD process. The number of ALD cycles and/or the number of CVD cycles may be varied to provide a SiN(B,C) film comprising a desired composition and/or thickness. For example, the number of cycles of the process for introducing boron and carbon components can be selected to provide a SiN(B,C) film having a desired boron and carbon components content (e.g., for demonstrating a desired etch rate, conformality performance, and/or other film characteristic).

In some embodiments, the number of cycles of a process for providing boron and carbon components of the silicon nitride film within a sequence can be from about one cycle to about twenty cycles, including from about one cycle to about ten cycles. In some embodiments, the process for providing the boron and carbon components can be repeated five times. For example, a pulsed CVD process for introducing boron and carbon components into a silicon nitride film can be repeated three times within a sequence. The cycling of the process for providing the boron and carbon components can be performed prior to additional cycling of a process for depositing a silicon nitride SiN film. For example, a sequence of a SiN(B,C) film deposition process can include first cycling a number of times a process for depositing a silicon nitride SiN film, and second followed by cycling for a number of times a process for adding the boron and carbon components to the SiN film.

In some embodiments, a ratio of a number of cycles of a process for depositing a silicon nitride film to a number of cycles of a process for introducing a boron and carbon components (e.g., a ratio of Y:X) within a sequence can be about 1:1 to about 100:1, including about 3:1 to about 50:1. In some embodiments, the ratio of the number of cycles for the process of depositing a silicon nitride film to the number of cycles of the process for introducing boron and carbon components within a sequence can be about 5:1 to about 20:1. The ratio can be expressed as a percentage or a boron carbon process fraction, such as a percentage of the total number of cycles in a sequence which is a process for introducing the boron and carbon components. For example, a boron carbon process fraction or a percentage of the total number of cycles in a sequence which is a process for introducing the boron and carbon components can be adjusted to provide a SiN(B,C) film having desired composition. The percentage or boron carbon process fraction may be calculated by the following formula: $X/(X+Y)*100\%$. In some embodiments, the boron carbon process fraction or the percentage of the total number of cycles in a sequence which is a process for introducing the boron and carbon components can be about 0.01% to about 50%, including about 5% to about 20%. For example, the boron carbon process fraction can be about 10%. For example, a process having a boron carbon process fraction of about 5.0% to about 10% can form a $SiN_x(B_y,C_z)$ film where x can be about 1.3 to about 1.8, y can be about 0.5 to about 1.5, and z can be about 0.3 to about 1.3.

A first phase and/or a second phase of an ALD process, and/or a CVD process can be performed at a process temperature of about 25° C. to about 800° C., including about 100° C. to about 600° C. The process temperature as referred to herein can comprise a temperature of a reactor chamber susceptor, a reactor chamber wall, and/or a temperature of the substrate itself. In some embodiments, a first phase and/or a second phase of an ALD process and/or a CVD process can be performed at a process temperature of about 150° C. to about 500° C. For example, one or both of the first phase and the second phase of the ALD process, and/or the CVD process can be performed at a process temperature of about 200° C. to about 400° C. For example, a first phase and/or a second phase of one or more cycles of an ALD process described herein may be performed in a reactor chamber having a susceptor, a substrate and/or a reactor chamber wall heated to a temperature of about 200° C. to about 400° C., such as a temperature of about 400° C. For example, the CVD process can be performed in a reactor chamber having a susceptor, a substrate and/or a reactor chamber wall heated to a temperature of about 400° C. In some embodiments, the CVD process for introducing boron and carbon components into the silicon nitride can be performed at a process temperature of less than 400° C., including for example from about 325° C. to about 400° C., and about 350° C. to about 400° C.

In some embodiments, a temperature of a process for depositing a silicon nitride SiN film and/or a process for introducing a boron and carbon components can be sufficiently high to facilitate a decomposition of one or more reactants (e.g., a silicon reactant and/or a nitrogen reactant of an ALD process, and/or a boron reactant of a CVD process), and/or reaction between reactants and/or between reactants and the substrate surface, while providing a process with a reduced thermal budget. In some embodiments, a process temperature for depositing the silicon nitride SiN film and/or introducing boron and carbon components can be about 325° C. to about 800° C., including about 350° C. to about 600° C., about 400° C. to about 600° C., or about 375° C. to about 450° C. For example, a CVD process for introducing boron and carbon components into a silicon nitride can be performed at a process temperature of about 400° C. (e.g., a CVD process including decomposing the boron reactant TEB for introducing the boron and carbon components to the silicon nitride film). In some embodiments, an ALD process for depositing the silicon nitride SiN film can be performed at a process temperature of about 400° C. (e.g., an ALD process in which one or more reactants may decompose in forming the SiN film). In some embodiments, a temperature of the ALD process can be different from a temperature of the CVD process. In some embodiments, the same temperature is used for the ALD process for forming the silicon nitride SiN film and the CVD process for adding boron and carbon components to the SiN film.

An example of a deposition process for forming a SiN(B, C) film can be performed (e.g., in a Pulsar®3000 chamber, commercially available from ASM America, Inc. of Phoenix, Ariz.) using a thermal ALD process for forming a silicon nitride SiN film. The thermal ALD process can be performed at a process temperature of about 400° C. on a 300 millimeter (mm) wafer, including a silicon reactant comprising octachlorotrisilane ($Si_3Cl_8$, OCTS) fed into the reactor chamber with a carrier gas (e.g., nitrogen) such that a silicon reactant pulse has a duration of about 1 second and is followed by a purge process (e.g., using purge gas comprising nitrogen) having a duration of about 5 seconds. The OCTS may be stored in a bubbler at a temperature of about 40° C. and provided into the reactor chamber from the bubbler (e.g., a mass flow rate of the OCTS may be controlled by controlling the extent to which a valve for delivering the OCTS into the reactor chamber is kept open). The thermal ALD process can include a nitrogen reactant comprising ammonia ($NH_3$) fed into the reactor chamber such that the nitrogen reactant pulse has duration of about 1 second and which is followed by a purge process (e.g., using purge gas comprising nitrogen) having a duration of about 5 seconds. The $NH_3$ may be provided into the reactor chamber from a gas source maintained at a pressure of about 1.5 Bar (e.g., a mass flow rate of the $NH_3$ may be controlled by controlling the extent to which a valve for delivering the $NH_3$ into the reactor chamber is kept open). The ALD process can be cycled a number of times. A number of cycles of the ALD process can be followed by a number of cycles of a thermal CVD process for introducing boron and carbon components into the SiN film. The thermal CVD process can be performed at a temperature of about 400° C. and can include a boron reactant pulse for providing a boron reactant comprising triethylboron ($B(C_2H_5)_3$, TEB) into the reactor chamber, where the boron reactant pulse can have a duration of about 0.5 seconds. The boron reactant pulse may be followed by a purge step (e.g., using purge gas comprising nitrogen) having a duration of about 5 seconds. For example, the SiN(B,C) deposition process can include a sequence comprising 19 cycles of the ALD process followed by 2 cycles of the CVD process (e.g., providing a boron carbon process fraction of about 10%), where the sequence is repeated 75 times.

A composition of a silicon nitride film comprising boron and carbon components may be adjusted, for example, by increasing or decreasing a boron carbon process fraction of the process for depositing the film. For example, a boron and carbon content of the film may be adjusted by adjusting a boron carbon process fraction of the film fabrication process. In some embodiments, the silicon nitride film comprising boron and carbon components can have about 0.1 atomic % to about 50 atomic % of boron, including about 1 atomic % to about 35 atomic % of boron. For example, the silicon nitride film comprising boron and carbon components can have about 5 atomic % to about 30 atomic % boron. In some embodiments, the silicon nitride film comprising boron and carbon components can have about 0.1 atomic % to about 50 atomic % of carbon, including about 1 atomic % to about 35 atomic % of carbon. For example, the silicon nitride film comprising boron and carbon components can have about 5 atomic % to about 30 atomic % carbon. In some embodiments, a silicon and/or a nitrogen content can be adjusted by adjusting a boron carbon process fraction of the film fabrication process.

In some embodiments, a SiN(B,C) film formed according to one or more processes described herein can have a desirable dielectric constant (κ-value). A dielectric constant of a SiN(B,C) film may be lower than that of conventional silicon nitride films. In some embodiments a SiN(B,C) film can have a dielectric constant less than about 7, including less than about 6. For example, a SiN(B,C) film may have a dielectric constant between about 4.8 and about 7, including between about 4.8 and 6, and between about 4.8 and about 5.5. In some embodiments, a dielectric constant of a SiN(B,C) film can be adjusted by adjusting a boron carbon process of the film fabrication process. In some embodiments, a SiN(B,C) film having a dielectric constant of about 5.5 can be formed using a deposition process having a boron carbon process fraction of about 10% or higher. SiN(B,C) films with reduced dielectric constants, for example dielectric constants less than that of conventional silicon nitride films, used for certain applications of a semiconductor device (e.g., as a spacer material for a transistor gate feature) may facilitate improvements in one or more device electrical parameters, including a reduction in device parasitic capacitances.

As described herein, a SiN(B,C) film can be a sacrificial film in a semiconductor device fabrication process. For example, the SiN(B,C) film may be selectively removed in an etch process. In some embodiments, a sacrificial SiN(B,C) film can be selectively removed during fabrication of a semiconductor device using an etch process comprising chlorine (Cl) and/or fluorine (F), such as chlorine and/or fluorine containing plasma processes. In some embodiments, a SiN(B,C) film may form a part of a finished semiconductor device. For example, the SiN(B,C) film may be more resistant to etch than one or more other materials used in the fabrication of the semiconductor device.

The SiN(B,C) film may have a desired etch selectivity with respect to another material in the device. For example, an etch selectivity of the SiN(B,C) film may be tuned by adjusting a boron and carbon components content of the film (e.g., by adjusting a boron carbon process fraction of the film fabrication process). In some embodiments, the SiN(B,C) film may be etched by a dry etch process and/or a wet etch process. For example, the SiN(B,C) film may be etched by a plasma etch process, including a fluorine-containing plasma. In some embodiments, the SiN(B,C) film can have a etch selectivity (e.g., a dry etch and/or a wet etch selectivity) of about 5 or greater with respect to another material of the device, including a selectivity of about 10 or greater, about 20 or greater, or about 50 or greater.

In some embodiments, the SiN(B,C) film can demonstrate a desired wet etch selectivity, such as a wet etch selectivity with respect to a thermal silicon oxide (TOX) layer. For example, the SiN(B,C) film may be more resistant to wet etch than the thermal silicon oxide layer, having a ratio of a wet etch rate of the SiN(B,C) film to a wet etch rate of a thermal silicon oxide layer less than about 1, less than about 0.5, or less than about 0.3. In some embodiments, the ratio of a wet etch rate of the SiN(B,C) film to a wet etch rate of the thermal silicon oxide layer can be less than about 0.1.

In some embodiments, one or more silicon nitride films comprising boron and carbon components (SiN(B,C)) formed according to one or more processes described herein can have a desired etch rate in a number of etchant solutions.

In some embodiments, a silicon nitride film comprising boron and carbon components (e.g., a SiN(B,C) film) may be resistant or substantially resistant to one or more wet etchants. For example, a SiN(B,C)) film can have an etch rate of less than about 1 nanometers per minute (nm/min), including less than about 0.5 nm/min, including less than about 0.2 nm/min and including less than about 0.1 nm/min, in one or more of the following etchant solutions at the provided temperatures: a concentrated nitric acid $HNO_3$ solution (e.g., a solution having a $HNO_3$ concentration of about 65 to about 75 weight %) at about 80° C., a 5.5 weight % hydrofluoric acid (HF) at room temperature (e.g. a temperature of about 25° C.), a solution having a ratio of nitric acid:hydrofluoric acid:water ($HNO_3$:HF:$H_2O$) at about 1:1:5 at about room temperature (e.g., a temperature of about 25° C.), an aqueous solution of sodium hydroxide (NaOH) having a concentration of NaOH of about 10 weight % at about room temperature (e.g., a temperature of about 25° C.), a concentrated hydrochloric acid (HCl) solution (e.g., a solution having an HCl concentration of about 35 to about 40 weight %) at about room temperature (e.g., a temperature of about 25° C.), and a concentrated sulfuric acid solution ($H_2SO_4$) (e.g., a solution having a $H_2SO_4$ concentration of greater than about 90 weight %) at about room temperature (e.g., a temperature of about 25° C.).

In some embodiments, a silicon nitride film comprising boron and carbon components (e.g., a SiN(B,C) film) may be resistant or substantially resistant to a wet etchant comprising phosphoric acid ($H_3PO_4$) at a concentration of about 85 weight % at about room temperature (e.g., a temperature of about 25° C.). In some embodiments, a silicon nitride film comprising boron and carbon components (e.g., a SiN(B,C) film) may be resistant or substantially resistant to one or more of the following wet etchants (e.g., an etch rate of less than about 3 nanometers/min (nm/min)), and after a dip in a 1 weight % hydrofluoric acid (HF) for about 2 minutes): phosphoric acid ($H_3PO_4$) at a concentration of about 85 weight % at about room temperature (e.g., a temperature of about 25° C.), aqueous sodium hydroxide (NaOH) having a concentration of about 10 weight % solution at about room temperature (e.g., a temperature of about 25° C.), a hydrochloric acid (HCl) solution having a concentration of about 35 to about 40 weight % (e.g., about 37 weight %) at about room temperature (e.g., a temperature of about 25° C.), and a sulfuric acid solution ($H_2SO_4$) having a concentration of greater than about 90 weight % (e.g., 98 weight %) at about room temperature (e.g., a temperature of about 25° C.).

In some embodiments, a SiN(B,C) film can have an etch rate of more than about 1.0 nanometers per minute (nm/min) in a solution having a ratio of hydrogen peroxide:hydrofluoric acid:water ($H_2O_2$:HF:$H_2O$) of about 5:5:90, by volume, at about room temperature (e.g., at a temperature of about 25° C.). In some embodiments, a SiN(B,C)) film can be etched subsequent to being exposed to a treatment in oxygen-containing atmosphere, including for example ozone and/or an oxygen-containing plasma (e.g., a plasma comprising oxygen atoms and/or other oxygen-containing radicals).

As described herein, a SiN(B,C) film may be deposited on and/or over a three-dimensional (3-D) structure while demonstrating desired conformality or step coverage. In some embodiments, a SiN(B,C) film can demonstrate desired conformality or step coverage over a three-dimensional structure having an aspect ratio of about 2:1 or higher, including about 3:1 or higher, about 5:1 or higher, or about 8:1 or higher. In some embodiments, a SiN(B,C) film can demonstrate desired conformality or step coverage over a three-dimensional structure having an aspect ratio of about 10:1 or higher, about 25:1 or higher, or about 50:1 or higher. In some embodiments, a SiN(B,C) film can demonstrate a desired step coverage over one or more features as described herein, including a step coverage of about 80% or higher, including about 90% or higher, about 95% or higher, or about 100%. In some embodiments, a SiN(B,C) film can demonstrate a step coverage of about 80% or higher, including about 90% or higher, about 95% or higher, or about 100%, when formed on three-dimensional structures having an aspect ratio of up to about 250:1, including up to about 150:1 and up to about 100:1.

In some embodiments, a portion of a SiN(B,C) film deposited on a sidewall of a three-dimensional structure can demonstrate a desired etch rate, for example, as compared to an etch rate of a portion of the film deposited on a top surface of the three-dimensional feature. In some embodiments, a portion of a SiN(B,C) film deposited on a sidewall of a three-dimensional structure can demonstrate a uniform or substantially uniform etch rate of the SiN(B,C) film as a portion of the SiN(B,C) film deposited on a top surface of the structure. For example, a ratio of an etch rate of a sidewall portion of the SiN(B,C) film to an etch rate of a top surface portion of the SiN(B,C) film can be less than about 4, including less than about 2, about 1.5. In some embodiments, the ratio is about 1.

In some embodiments, a silicon nitride film comprising boron and carbon components (e.g., a SiN(B,C) film) can be subjected to an annealing process subsequent to its formation. In some embodiments, the SiN(B,C) film can be annealed in an inert gas atmosphere (e.g., an atmosphere comprising nitrogen and/or one or more noble gases). For example, the annealing process may be performed in a nitrogen atmosphere at a temperature of about 600° C. or higher, about 800° C. or higher, or 1000° C. or higher. In some embodiments, the SiN(B,C) film can be annealed at a temperature of up to about 900° C. In some embodiments, the SiN(B,C) film can be annealed in a hydrogen atmosphere, such as at a temperature of about 600° C. or higher, about 800° C. or higher, or 1000° C. or higher, including up to about 900° C. In some embodiments, a boron and carbon component of the SiN(B,C) film does not diffuse out of the film when annealed in a nitrogen atmosphere at a temperature of up to about 900° C. In some embodiments annealing can be carried out in a hydrogen or inert gas atmosphere, for example at a temperature of about 600° C. or higher, about 800° C. or higher, or 1000° C. or higher.

Examples of SiN(B,C) Films

Figure 8A:
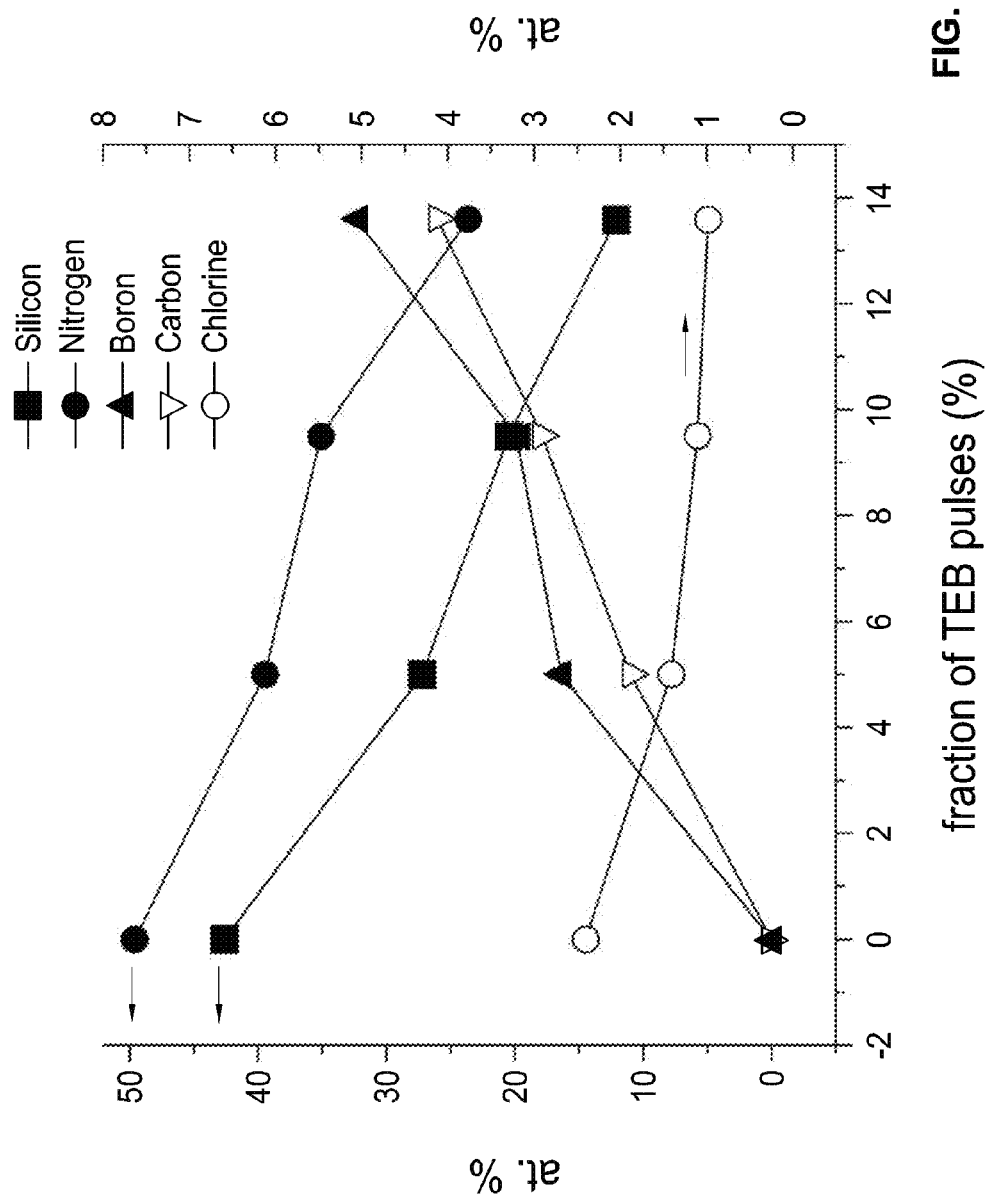
FIG. 8A is a graph of compositions of examples of silicon nitride films comprising boron and carbon as a function of the percentage of TEB pulses in the deposition process.

FIG. 8A graphs the compositions (e.g., as measured by rutherford backscattering spectrometry (RBS)) of four films having a boron carbon process fraction (e.g., a percentage of the total number of cycles of which are cycles of the process for introducing a boron and carbon content into a silicon nitride SiN film) from about 0% to about 15%. The atomic percent of silicon, nitrogen, boron, carbon and chlorine of each of the four films are shown, with the atomic percent of silicon, nitrogen, boron and carbon shown with reference to the left vertical axis and the atomic percent of chlorine shown with reference to the right vertical axis. Each of the four films can be formed according to one or more processes as described herein. For example, SiN films and SiN(B,C) films of varying composition can be deposited using a deposition process performed in a Pulsar®03000 chamber (e.g., commercially available from ASM America, Inc. of Phoenix, Ariz.) using a thermal ALD process for forming a silicon nitride SiN film. The thermal ALD process can be performed at a temperature of about 400° C., and a pressure of about 0.1 Torr to about 10 Torr, on a 300 millimeter (mm) wafer, including a silicon reactant comprising octachlorotrisilane ($Si_3Cl_8$, OCTS) fed into the reactor chamber with a carrier gas (e.g., nitrogen) such that a silicon reactant pulse has a duration of about 1 second and is followed by a purge step (e.g., using purge gas comprising nitrogen) having a duration of about 5 seconds. The OCTS may be stored in a bubbler at a temperature of about 40° C. and provided into the reactor chamber from the bubbler (e.g., a mass flow rate of the OCTS may be controlled by controlling the extent to which a valve for delivering the OCTS into the reactor chamber is kept open). The thermal ALD process can include a nitrogen reactant comprising ammonia ($NH_3$) fed into the reactor chamber such that the nitrogen reactant pulse has duration of about 1 second and which is followed by a purge step (e.g., using purge gas comprising nitrogen) having a duration of about 5 seconds. The $NH_3$ may be provided into the reactor chamber from a gas source maintained at a pressure of about 1.5 Bar (e.g., a mass flow rate of the $NH_3$ may be controlled by controlling the extent to which a valve for delivering the $NH_3$ into the reactor chamber is kept open). The ALD process can be cycled a number of times. A number of cycles of the ALD process can be followed by a number of cycles of a pulsed thermal CVD process for introducing boron and carbon components into the SiN film. The thermal CVD process can be performed at a temperature of about 400° C., and a pressure of about 0.1 Torr to about 10 Torr, and can include a boron reactant comprising triethylboron ($B(C_2H_5)_3$, TEB) fed into the reactor chamber where the boron reactant pulse can have a duration of about 0.5 seconds, the reactant pulse followed by a purge step (e.g., using purge gas comprising nitrogen) having a duration of about 5 seconds. For example, the SiN(B,C) deposition process can include a sequence including a number of cycles of the ALD process followed by one to three cycles of the CVD process (e.g., to provide boron carbon process fractions of about 0% to about 15%), where the sequence can be repeated a number of times (e.g., about 50 times to about 100 times). For example, the sequence may be repeated 75 times.

The graphs of FIG. 8A show that a boron and a carbon content of a film can increase with an increase in the boron carbon process fraction. For example, the boron and carbon components content can increase linearly or substantially linearly with an increase in the boron carbon process fraction. FIG. 8A shows that silicon content and nitrogen content can decrease with an increase in the boron carbon process fraction. For example, the silicon and/or nitrogen content can decrease linearly or substantially linearly with an increase in the boron carbon process fraction. FIG. 8A further shows that chlorine content can decrease with an increase in a boron carbon process fraction.

Figure 8B:
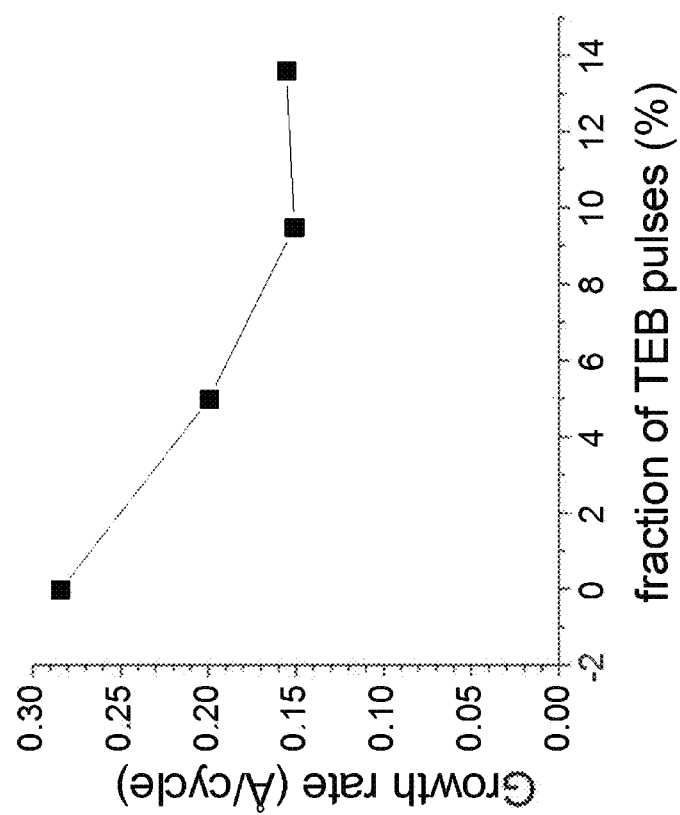
FIG. 8B is a graph of film growth rates of examples of silicon nitride films comprising boron and carbon as a function of the percentage of TEB pulses in the deposition process.

FIG. 8B graphs a film growth rate in angstroms per cycle (Å/cycle) of four films formed by fabrication processes having a boron carbon process fraction from about 0% to about 15%. A cycle, as shown in FIG. 8B, can correspond to a sequence including a number of cycles of a process for providing a silicon nitride SiN film and a number of cycles of a process for introducing boron and carbon into the SiN film (e.g., sequence 702 of FIG. 7). Each of the four films can be formed according to one or more processes as described herein, such as the processes as described with reference to FIG. 8A. FIG. 8B shows that a film growth rate can decrease with an increase in a boron carbon process fraction. Without being limited by any particular theory or mode of operation, boron reactants adsorbed onto a surface of a substrate may reduce the ability of silicon reactants and/or nitrogen reactants to properly adsorb onto the surface of the substrate (e.g., silicon reactants and/or nitrogen reactants from a subsequent silicon nitride deposition process). Increasing a boron carbon process fraction (e.g., as increased amount of boron reactants are provided in a SiN(B,C) film fabrication process), may increasingly reduce the ability of silicon and/or nitrogen reactants from subsequent silicon nitride deposition processes to adsorb onto the substrate surface. Further, without being limited by any particular theory or mode of operation, the reduced ability of silicon and/or nitrogen reactants from subsequent silicon nitride deposition processes to adsorb onto the substrate surface may also result in a film having higher boron and carbon components content than would otherwise be expected based on the boron carbon process fraction.

In some embodiments, a film thickness non-uniformity (e.g., a one sigma (1σ) thickness non-uniformity) may not be negatively impacted by an increased boron carbon process fraction. In some embodiments, a film thickness non-uniformity remain the same or substantially the same with increased boron carbon process fraction. For example, a film thickness non-uniformity of a process for depositing a silicon nitride film having boron and carbon components can be less than about 20%, including less than about 10%, and about 5%. In some embodiments, a film thickness non-uniformity can be improved with a decrease in a boron carbon process fraction up to a particular value. For example, a boron carbon process fraction of less than about 10% can provide an improved film thickness non-uniformity.

Figure 9:
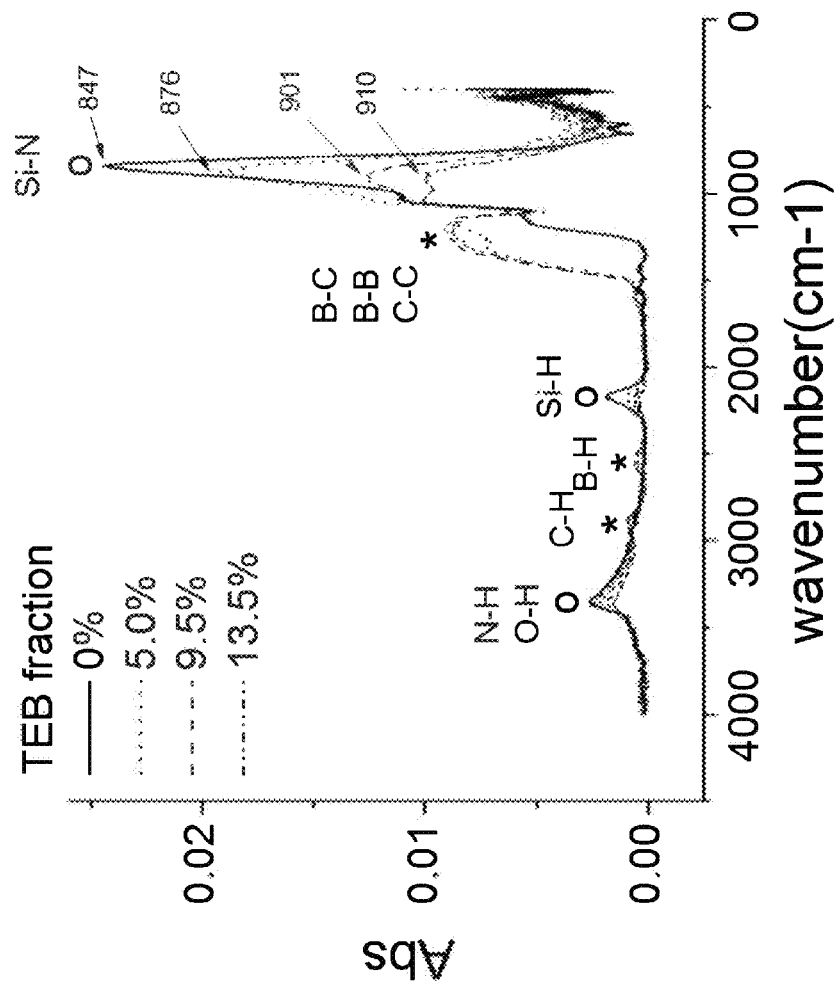
FIG. 9 shows FTIR spectra of examples of silicon nitride films comprising boron and carbon.

Referring to FIG. 9, a Fourier Transform Infrared Spectroscopy (FTIR) analysis of four films having boron carbon process fractions from about 0% to about 15% is shown. Each of the four films can be formed according to one or more processes as described herein, such as the processes as described with reference to FIG. 8A. The FTIR indicates presence of various features within each film, including for example the presence of various chemical bonds. For example, the FTIR analysis can show addition of features and/or changes in features of a film after being subject to a film fabrication process. Peaks corresponding to the various features of each film in FIG. 9 are labeled with an "0" or with an "*" to indicate an origin of the marked feature. For example, peaks in the graph marked by an "0" indicates that the features (e.g., a hydrogen bonded to a nitrogen (N—H), a hydrogen bonded to an oxygen (O—H), a hydrogen bonded to a silicon (Si—H), a nitrogen bonded to a silicon (Si—N)) are contributed by a process for depositing the silicon nitride SiN film. For example, peaks marked by an "*" indicate that the features (e.g., a hydrogen bonded to a carbon, a hydrogen bonded to a boron, a carbon bonded to a boron, a carbon bonded to another carbon, a boron bonded to another boron) are contributed by a process for introducing a boron and carbon components into the silicon nitride SiN film. FIG. 9 shows that a process for introducing the boron and carbon into the silicon nitride film can provide features such as a hydrogen bonded to a carbon (C—H) and/or a hydrogen bonded to a boron (B—H) (e.g., as shown in FIG. 9 between about 2500 $cm^{-1}$ and about 3000 $cm^{-1}$), and features such as a carbon bonded to a boron (B—C), a boron bonded to another boron (B—B) and/or a carbon bonded to another carbon (C—C) (e.g., as shown in FIG. 9 between about 1000 $cm^{-1}$ and about 1500 $cm^{-1}$, such as at about 1200 $cm^{-1}$). FIG. 9 shows a decrease in Si—H bonding features with an increase in the boron carbon process fraction. A reduction in Si—H bonding features may facilitate improved SiN(B,C) film performance, for example an improvement in an electrical property of the film. FIG. 9 also shows that a peak corresponding a nitrogen bonded to a silicon (Si—N) can shift to a higher wavenumber with an increase in the boron carbon process fraction, for example indicating a change in bonds between a silicon and a nitrogen.

FIG. 10 shows analysis based on X-ray reflectivity (XRR) measurements of four films having boron carbon process fractions from about 0% to about 15%. Film thickness in nanometers, film density in grams per cubic centimeter ($g/cm^3$), and film roughness in nanometers (nm) are shown. Each of the four films can be formed according to one or more processes as described herein, such as the processes as described with reference to FIG. 8A. FIG. 10 shows a decrease in a film density, and a slight increase in a film roughness, with an increase in a boron carbon process fraction.

Figure 11:
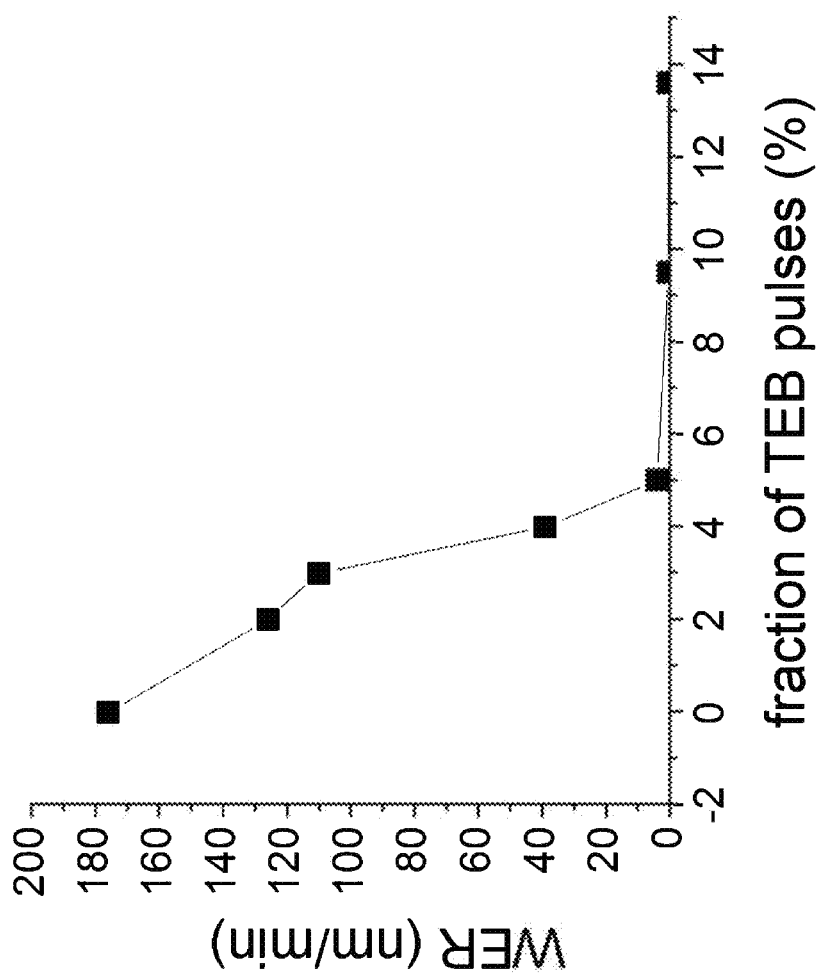
FIG. 11 is a graph of film etch rates of examples of silicon nitride films comprising boron and carbon as a function of the fraction of TEB pulses in the deposition process.

FIG. 11 graphs wet etch rates, shown in nanometers per minute (nm/min) in a dilute HF solution (e.g., 0.5 weight % HF solution) of corresponding films formed by processes having various boron carbon process fractions. The films can be formed according to one or more processes as described herein, such as the processes as described with reference to FIG. 9A. As shown in FIG. 11, a wet etch rate of a silicon nitride film comprising boron and carbon components (e.g., a SiN(B,C) film) can decrease significantly with an increased boron carbon process fraction. FIG. 11 shows that film deposition processes having a boron carbon process fraction higher than about 5% can produce SiN(B,C) films having a significantly reduced wet etch rate. For example, a SiN(B,C) film having a desired wet etch rate in dilute HF may be formed by a process having a boron carbon process fraction of higher than about 10% (e.g., a SiN(B,C) film suitable for a spacer application).

FIGS. 12A-12D show wet etch performance of a silicon nitride film comprising boron and carbon components (e.g., a SiN(B,C) film) deposited on trench structures 1200 of a substrate. The film can be formed according to one or more processes as described herein, such as the processes as described with reference to FIG. 8A. FIGS. 12A and 12C show scanning electron microscopy (SEM) images of the trench structures 1200 having the film 1202 on one or more surfaces of the trench structures 1200 prior exposing the film 1202 to a wet etchant. For example, a wet etchant comprising a dilute hydrofluoric acid (HF) solution is used (e.g., a 0.5 weight % HF solution) for a period of time (e.g., for about 2 minutes). FIGS. 12B and 12D show the film 1202 subsequent to exposure to the wet etchant. FIGS. 12B and 12D show that the film 1202 is unaffected or substantially unaffected by the wet etchant. For example, a ratio of the wet etch rate of the film 1202 to an etch rate of an underlying thermal oxide layer (e.g., thermal silicon dioxide, TOX) can be less than about 3:10. FIGS. 12B and 12D also show the film 1202 post wet etch providing conformal coverage of the trench structures 1200, for example, the film 1202 not delaminating from the underlying trench structures and/or not demonstrating other defects.

FIGS. 13A-13D show scanning electron microscopy (SEM) images of a SiN(B,C) film on surfaces of high aspect ratio trenches 1300 subsequent to being exposed to a wet etchant (e.g., subsequent to a dip in a dilute hydrofluoric acid (HF or dHF) solution, such as a 0.5 weight % HF solution) for a period of about 4 minutes. The film can be formed according to one or more processes as described herein, such as the processes as described with reference to FIG. 8A. FIG. 13A is a lower magnification image, at 13 k× magnification, of the structures 1300, showing an upper portion 1302 of the trenches, a mid-section 1304 of the trenches, and a lower section 1306 of the trenches. The upper portion 1302 is shown at higher magnification, at 250 k× magnification in FIG. 13B, the mid-section 1304 is shown at higher magnification, at 250 k× magnification, in FIG. 13C, and the lower-section 1306 is shown in higher magnification, at 250 k× magnification, in FIG. 13D. As shown in FIGS. 13A-13D, the SiN(B,C) film can demonstrate excellent conformality or step coverage of the high aspect ratio trenches 1300 subsequent to being exposed to the wet etchant. For example, FIGS. 13A-13D show a SiN(B,C) film having a thickness of about 20 nm formed on an upper portion 1302 of the trench structure 1300, a thickness of about 20 nm formed on a mid-section 1304 of the trench structure 1300, and a thickness of about 19 nm formed on a lower portion 1306 of the trench structure 1300 (e.g., a conformality of about 95% or greater). A ratio of the wet etch rate of the SiN(B,C) film as shown in FIGS. 13A-13D to an etch rate of an underlying thermal oxide (e.g., thermal silicon dioxide, TOX) can be less than about 1:2.

FIGS. 14A-14D show scanning electron microscopy (SEM) images of a silicon nitride film comprising boron and carbon (e.g., a SiN(B,C) film) on surfaces of high aspect ratio trenches 1400 before being exposed to a wet etchant. The film can be formed according to one or more processes as described herein, such as the processes as described with reference to FIG. 8A. FIG. 14A is a lower magnification image, at 11 k× magnification, of the trench structures 1400, with FIG. 14B showing an upper portion 1402 of the trenches 1400 at a higher magnification of 200 k×, FIG. 14C showing a mid-section 1404 of the trenches 1400 at a higher magnification of 200 k×, and FIG. 14D showing a lower section 1406 of the trenches 1400 at a higher magnification of 200 k×. FIGS. 14A-14D show that the SiN(B,C) film can demonstrate excellent step coverage or conformality. For example, FIGS. 14B-14D show a SiN(B,C) film having a thickness of about 23 nm formed on an upper portion 1402 of the trench structure 1400, a thickness of about 23 nm formed on a mid-section 1404 of the trench structure 1400, and a thickness of about 24 nm formed on a lower portion 1406 of the trench structure 1400 (e.g., a conformality of about 95% or greater).

An etch rate of the SiN(B,C) film in the wet etchant (e.g., the wet etchant having the ratio of $H_2O_2$:HF:$H_2O$ of about 5:5:90 by volume) can be about 1.1 nanometers per min (nm/min)±about 0.3 nm/min. In some embodiments, the SiN (B,C) film can be soaked in ozone ($O_3$) prior to being exposed to the wet etchant, for example to increase an etch rate of the film. An etch rate of the SiN(B,C) film soaked in ozone prior to being exposed to the wet etch can have a film etch rate of about 2.2 nm/min±about 0.5 nm/min. In some embodiments, the etch rates can vary depending on the film composition.

A SiN(B,C) film deposited on blanket silicon wafer analyzed by rutherford backscattering spectrometry (RBS) prior to and after a dip in a 0.5 weight % HF solution for about 2 minutes show that the composition of the as deposited film was: silicon (Si) 20 atomic %, nitrogen (N) 35 atomic %, boron (B) 20 atomic %, carbon (C) 18 atomic %, oxygen (O) 6 atomic %, chlorine (Cl) 1 atomic %. The composition of the film subsequent to being dipped in the HF solution was: Si 19 atomic %, N 30 atomic %, B 25 atomic %, C19 atomic %, O 7 atomic %, Cl 1 atomic %. The RBS analysis shows that the composition of the film may not be significantly impacted by the HF dip process.

Although this disclosure has been provided in the context of certain embodiments and examples, it will be understood by those skilled in the art that the disclosure extends beyond the specifically described embodiments to other alternative embodiments and/or uses of the embodiments and obvious modifications and equivalents thereof. In addition, while several variations of the embodiments of the disclosure have been shown and described in detail, other modifications, which are within the scope of this disclosure, will be readily apparent to those of skill in the art based upon this disclosure. It is also contemplated that various combinations or sub-combinations of the specific features and aspects of the embodiments may be made and still fall within the scope of the disclosure. It should be understood that various features and aspects of the disclosed embodiments can be combined with, or substituted for, one another in order to form varying modes of the embodiments of the disclosure. Thus, it is intended that the scope of the disclosure should not be limited by the particular embodiments described above.

The headings provided herein, if any, are for convenience only and do not necessarily affect the scope or meaning of the devices and methods disclosed herein.

What is claimed is:

1. A method of depositing a silicon nitride thin film comprising boron and carbon on a substrate in a reaction space comprising:
   at least one silicon nitride cycle comprising:
      contacting the substrate with a vapor-phase silicon precursor;
      contacting the substrate with a nitrogen reactant; and
   subsequently contacting the substrate with a vapor phase boron precursor, to form a $SiN_x(B_y,C_z)$ thin film, wherein x is from 0.5 to 3.0, wherein y is from 0.1 to 5.0, and wherein z is from 0.1 to 5.0.

2. The method of claim 1, wherein the silicon nitride cycle is performed two or more times.

3. The method of claim 2, wherein contacting the substrate with the vapor phase boron precursor is performed after each silicon nitride cycle.

4. The method of claim 2, wherein a number of silicon nitride cycles is performed at a ratio to a number of times of contacting the substrate with the vapor phase boron precursor.

5. The method of claim 4, wherein the ratio is from 1:1 to 100:1.

6. The method of claim 1, wherein no plasma reactant is provided.

7. The method of claim 1, wherein contacting the substrate with the nitrogen-containing reactant comprises a plasma process.

8. The method of claim 1, wherein the reaction space is part of a batch reactor.

9. The method of claim 1, wherein the silicon nitride cycle comprises an atomic layer deposition process.

10. The method of claim 9, wherein the vapor phase boron precursor decomposes on the substrate.

11. The method of claim 1, wherein the silicon precursor is selected from the group consisting of silicon halides, silicon alkylamines, and silanes.

12. The method of claim 1, wherein the boron precursor is selected from the group consisting of boron halides, alkylborons, and boranes.

13. The method of claim 1, wherein the boron precursor decomposes on the substrate.

14. The method of claim 1, wherein the silicon nitride thin film is deposited over a three-dimensional structure.

15. The method of claim 1, wherein the silicon nitride thin film has an etch rate of less than 0.2 nm/min in dilute hydrofluoric acid solution.

16. A method of depositing a silicon nitride thin film on a substrate in a reaction space comprising:
   a silicon nitride cycle comprising:
      contacting the substrate with a vapor-phase silicon precursor so that the silicon precursor is adsorbed to a surface of the substrate;
      removing excess silicon precursor and reaction byproducts from the substrate surface;
      contacting the adsorbed silicon precursor substrate with a nitrogen reactant; and subsequently contacting the substrate with a vapor-phase boron precursor, to form a $SiN_x(B_y,C_z)$ thin film, wherein x is from 0.5 to 3.0, wherein y is from 0.1 to 5.0, and wherein z is from 0.1 to 5.0, wherein the vapor-phase boron precursor decomposes on the substrate.

17. The method of claim 16, wherein the silicon nitride cycle is performed two or more times.

18. The method of claim 17, wherein contacting the substrate with the vapor phase boron precursor is performed after each silicon nitride cycle.

19. The method of claim 17, wherein a number of silicon nitride cycles is performed at a ratio to a number of times of contacting the substrate with the vapor phase boron precursor.

20. The method of claim 19, wherein the ratio is from 1:1 to 100:1.

21. The method of claim 16, wherein a process temperature of the method is 200° C. to 400° C.

22. The method of claim 16, wherein the silicon nitride thin film has a boron content of 0.1 to 50 atomic %.

23. The method of claim 16, wherein the silicon nitride thin film has a carbon content of 0.1 to 50 atomic %.

24. The method of claim 16, wherein a boron atom in the silicon nitride thin film is bonded to a carbon atom.

25. The method of claim 16, further comprising treating the silicon nitride thin film in an oxygen-containing atmosphere and etching the treated silicon nitride thin film.

26. The method of claim 16, wherein the silicon nitride thin film is deposited conformally over a three-dimensional structure having an aspect ratio of greater than 8:1.

27. The method of claim 26, wherein the silicon nitride thin film has a step coverage of greater than 95%.

28. The method of claim 26, wherein a ratio of an etch rate of the silicon nitride thin film in a sidewall of the three-dimensional structure to an etch rate of the silicon nitride thin film on a top surface of the three-dimensional structure is less than 4.

29. The method of claim 16, wherein the silicon nitride thin film has a wet etch rate ratio to thermal silicon oxide of less than 0.5 in dilute hydrofluoric acid solution.

30. The method of claim 16, wherein the silicon nitride thin film comprising boron and carbon is substantially free of distinct layers.

* * * * *